United States Patent
Fry et al.

(10) Patent No.: US 10,551,240 B2
(45) Date of Patent: Feb. 4, 2020

(54) SELF-CLEANING LIQUID LEVEL SENSOR

(71) Applicant: International Business Machines Corporation, Armonk, NY (US)

(72) Inventors: Jonathan Fry, Fishkill, NY (US); Daniel Piper, Vancouver, WA (US); Jang Sim, Dutchess, NY (US); Yongchun Xin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 15/824,258

(22) Filed: Nov. 28, 2017

(65) Prior Publication Data
US 2019/0162578 A1    May 30, 2019

(51) Int. Cl.
*G01F 23/70* (2006.01)
*G01F 23/24* (2006.01)
*G01F 23/76* (2006.01)

(52) U.S. Cl.
CPC .......... *G01F 23/703* (2013.01); *G01F 23/241* (2013.01); *G01F 23/76* (2013.01); *B81B 2201/0292* (2013.01); *B81C 2201/0101* (2013.01); *B81C 2203/05* (2013.01)

(58) Field of Classification Search
None
See application file for complete search history.

(56) References Cited

U.S. PATENT DOCUMENTS

| | | | | |
|---|---|---|---|---|
| 2,233,235 A | * | 2/1941 | Witthaus | G01F 23/76 137/228 |
| 3,010,320 A | * | 11/1961 | Sollecito | G01F 23/263 361/284 |
| 3,050,999 A | * | 8/1962 | Edwards | B64D 37/005 73/304 C |
| 3,200,645 A | * | 8/1965 | Levins | G01F 23/70 200/840 |
| 3,260,903 A | * | 7/1966 | Kumano | G01F 23/268 361/284 |

(Continued)

OTHER PUBLICATIONS

Grayson, et al., "A BioMEMS Review: MEMS Technology for Physiologically Integrated Devices", Proceedings of the IEEE, vol. 92, No. 1, Jan. 2004, pp. 6-21, http://ieeexplore.ieee.org/document/1258169/?reload=true.

(Continued)

*Primary Examiner* — Paul M. West
*Assistant Examiner* — Mark A Shabman
(74) *Attorney, Agent, or Firm* — Alexander G. Jochym

(57) ABSTRACT

A self-cleaning sensor to determine a level of a liquid includes a tube with an interior coating and a plurality of horizontally aligned, electrically isolated, electrical contacts. The self-cleaning sensor includes the plurality of horizontally aligned, electrically isolated, electrical contacts that each terminate in an outer surface of an interior wall of the tube and are electrically connected to one or more electrical devices in a cap residing on the tube. Additionally, the self-cleaning sensor includes a float that is composed of a low density, low dielectric constant material buoyant in one or more liquids to be measured where each horizontal dimension of the float corresponds to each horizontal dimension of the tube.

20 Claims, 14 Drawing Sheets

(56) References Cited

U.S. PATENT DOCUMENTS

| | | | | |
|---|---|---|---|---|
| 3,343,415 A * | 9/1967 | Johnston | G01F 23/263 73/304 C |
| 3,389,602 A * | 6/1968 | Clemens | B64G 1/402 244/135 R |
| 3,759,286 A * | 9/1973 | Page | G01F 23/241 137/392 |
| 3,827,305 A | 8/1974 | Gilson et al. | |
| 4,055,991 A * | 11/1977 | Bridwell | G01F 23/66 47/59 R |
| 4,169,377 A * | 10/1979 | Scheib | G01F 23/241 73/304 R |
| 4,295,370 A * | 10/1981 | Bristol | G01F 23/268 361/284 |
| 4,457,171 A * | 7/1984 | Gebauer | G01F 23/72 73/305 |
| 4,568,874 A * | 2/1986 | Kramer | G01F 23/266 324/611 |
| 4,601,201 A * | 7/1986 | Oota | G01F 23/263 340/870.16 |
| 4,637,254 A * | 1/1987 | Dyben | G01F 23/76 340/624 |
| 4,702,107 A * | 10/1987 | Guerrini | G01F 23/68 338/33 |
| 4,730,489 A * | 3/1988 | Hoekstra | G01F 23/263 324/689 |
| 4,756,076 A * | 7/1988 | Dyben | G01F 23/68 156/201 |
| 4,806,847 A * | 2/1989 | Atherton | G01F 23/266 324/665 |
| 4,987,776 A * | 1/1991 | Koon | G01F 23/265 340/612 |
| 5,103,368 A * | 4/1992 | Hart | G01F 23/268 361/284 |
| 5,146,785 A * | 9/1992 | Riley | G01F 23/70 338/176 |
| 5,224,379 A | 7/1993 | Koebernik et al. | |
| 5,247,710 A * | 9/1993 | Carder | E04H 4/12 137/392 |
| 5,477,727 A * | 12/1995 | Koga | G01F 23/263 361/284 |
| 5,493,907 A * | 2/1996 | Misuraca | B67D 7/56 73/323 |
| 5,626,053 A | 5/1997 | Williamson | |
| 5,719,556 A | 2/1998 | Albin et al. | |
| 6,539,797 B2 * | 4/2003 | Livingston | G01F 23/266 73/290 R |
| 6,688,171 B2 * | 2/2004 | Kramp | G01F 23/68 73/314 |
| 6,748,804 B1 | 6/2004 | Lisec et al. | |
| 6,915,692 B2 * | 7/2005 | Ricco | F02M 37/103 73/313 |
| 7,334,471 B2 | 2/2008 | Maatuk | |
| 7,432,725 B2 * | 10/2008 | Sieh | G01F 23/268 324/662 |
| 8,549,911 B2 | 10/2013 | Rudd et al. | |
| 8,684,700 B2 * | 4/2014 | Carson-Rowland | G01F 23/242 417/36 |
| 8,763,455 B1 | 7/2014 | Chang | |
| 9,335,201 B2 | 5/2016 | Huang et al. | |
| 2001/0054312 A1 * | 12/2001 | Czarnek | G01D 5/2046 73/313 |
| 2005/0266571 A1 | 12/2005 | Stout et al. | |
| 2011/0303004 A1 * | 12/2011 | Carson-Rowland | G01F 23/24 73/304 R |
| 2013/0068015 A1 * | 3/2013 | Sinha | G01F 23/263 73/304 C |
| 2019/0162578 A1 * | 5/2019 | Fry | G01F 23/703 |

OTHER PUBLICATIONS

Groen, et al., "Design Considerations for a Micromachines Proportional Control Valve", Micromechanics 2012, 3(2), 396-412, http://www.mdpi.com/2072-666X/3/2/396/htm.

"Glucometer Test Kit", How Glucometer test kit is made—material, history, used, parts, steps . . . , Made How, vol. 7, 6 pages, Copyright 2017 Advameg, Inc., http://www.madehow.com/Volume-7/Glucometer-Test-Kit.html.

Marsh, et al., "Design Optimization of an Implantable Device Concept for Passive Ocular Drug Delivery", J. Med. Devices 8(2), 021005, Mar. 7, 2014, 3 pages, Paper No. MED-13-1260, Copyright 2017 asme.org, http://medicaldevices.asmedigitalcollection.asme.org/article.aspx?articleid=1876527.

"MEMS Flow Sensors Selection", OMRON, 3 pages, Copyright OMRON Corporation 2017, https://www.omron.com/ecb/products/sensor/special/mems/flowsensor/.

Suk, et al., "Capillary flow control using hydrophobic patterns", J. Micromech. Microeng. 17 (2007) N11-N15, Copyright IOP Publishing Ltd., published Feb. 22, 2007, 5 pages, http://iopscience.iop.org/article/10.1088/0960-1317/17/4/N01/pdf.

"Wireless Drug Delivery Using MicroCHIPS", NANALYZE, Apr. 2, 2014, 6 pages, http://www.nanalyze.com/2014/04/wireless-drug-delivery-using-microchips/.

* cited by examiner

SECTION A-A

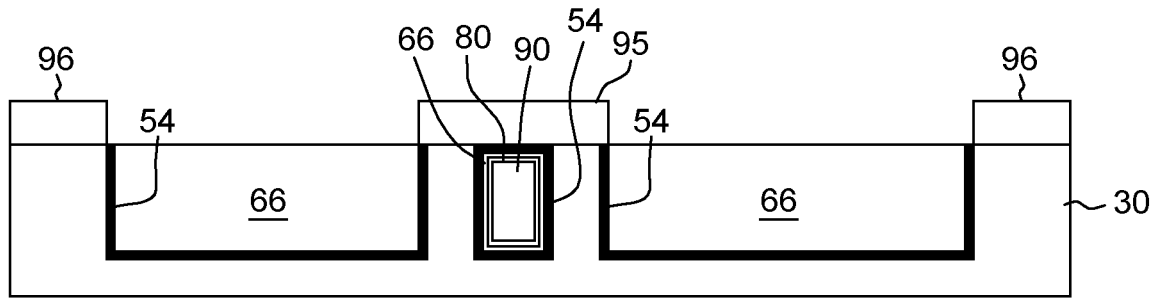
SECTION B-B
FIG. 16
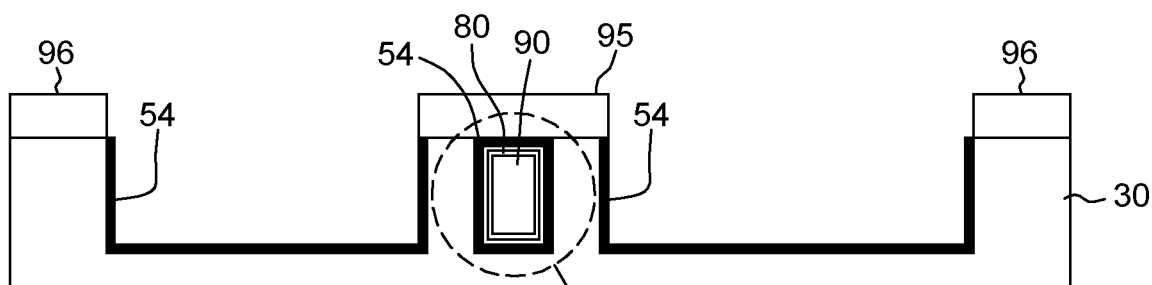
FIG. 17
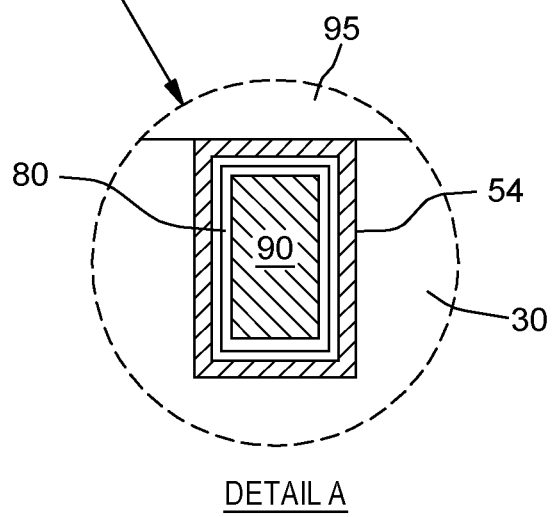
DETAIL A

SECTION C-C

SIDE VIEW

TOP VIEW

CROSS SECTION D-D

SELF-CLEANING LIQUID LEVEL SENSOR

BACKGROUND OF THE INVENTION

The present invention relates generally to the field of sensors, and more particularly to a liquid level sensor for microelectromechanical systems (MEMS).

The field of microelectromechnical systems or MEMS includes use of the technology of microscopic devices, particularly those with moving parts. Typically, MEMS devices are made up of components between 1 and 100 micrometers in size (i.e., 0.001 to 0.1 mm), and MEMS devices generally range in size from 20 micrometers to a millimeter (i.e., 0.02 to 1.0 mm). MEMS devices typically consist of a central unit that processes data such as a microprocessor and several components that interact with the surroundings such as micro-sensors and micro-actuators.

An especially important area of growth and use of MEMS devices is bio-medical or biological microelectromechanical systems also known as Bio-MEMS devices. Bio-MEMS devices are microscopic devices with electrical and/or mechanical parts suitable for biological applications. Examples of biological applications for Bio-MEMS devices include lab-on-a chip, which is a device that integrates one or several laboratory functions on a single integrated circuit, implantable microelectrodes to send or to receive bioelectrical signals from the nervous system to monitor organ functions, micro-needles, or implantable micro-systems applicable for controlled drug delivery in-situ or in a patient.

Precise measurement and delivery of very small quantities of chemicals or drugs is important in MEMS devices and in particular, Bio-MEMS applications. Applications requiring development of a number of miniaturized sensors or miniaturized biosensors using transducers that can convert an electrical signal or a mechanical deflection, for example, into a precise measurement continue to grow. Mechanical detection in MEMS applications typically uses micro-scale cantilevers or micro-scale plates or membranes where measurements of movement or mechanical deflection can occur optically, such as by laser reflection, or electrically, by a piezo-resistor or other similar device, are commonly used in micromechanical sensors. Various types of electrical and electrochemical measurements for MEMS applications monitored by sensors, such as potentiometric sensors, amperometric biosensors, and chemical field-effect transistors, are commonly being used in MEMS devices and Bio-MEMS device applications.

SUMMARY

Embodiments of the present invention disclose a self-cleaning sensor to determine a level of a liquid, the sensor includes a tube with an interior coating and a plurality of horizontally aligned, electrically isolated, electrical contacts. The sensor includes the plurality of horizontally aligned, electrically isolated, electrical contacts that each terminate in an outer surface of an interior wall of the tube and are electrically connected to one or more electrical devices in a cap residing on the tube. Additionally, the sensor includes a float that is composed of a low density, low dielectric constant material buoyant in one or more liquids to be measured where each horizontal dimension of the float corresponds to each horizontal dimension of the tube.

Embodiments of the present invention disclose a method of determining a level of a liquid by a sensor, the method includes one or more electrical devices in a cap of the sensor receiving an electrical output from one or more pairs of horizontally aligned electrical contacts extending through an interior wall of a tube in the sensor when the horizontally aligned electrical contacts are electrically connected by a liquid. The method includes one or more electrical devices in the cap determining a level of the liquid in the tube of the sensor based, at least in part, on the electrical output received from the one or more pairs of horizontally aligned electrical contacts extending through the exterior wall of the tube that are electrically connected by the liquid.

Embodiments of the present invention disclose a method of fabricating a self-cleaning sensor for determining a level of a liquid, the method includes patterning a resist on a substrate and partially removing a plurality of portions of a substrate from a plurality of exposed regions of the substrate creating a plurality of raised portions of the substrate around each of an outer edge of the substrate and two raised parallel portions of the substrate extending from a first raised portion of one of the outer edges of the substrate to a second raised portion of an opposite outer edge of the substrate. The method includes depositing a layer of hydroscopic material over the substrate and, then depositing a trench material in the plurality of portions of the substrate partially removed. Furthermore, the method includes forming a plurality of circuit lines on a top surface of the of the substrate on the two raised parallel portions of the substrate extending from the first raised portion of one of the outer edges of the substrate to the second raised portion of an opposite outer edge of the substrate where the plurality of circuit lines each extend through the layer of the hydroscopic material to terminate in a first end on one of two facing interior edges of the two raised parallel portions of the substrate forming horizontally aligned pairs of circuit line terminations and each of the plurality of circuit lines terminate in a second end in a top edge of the substrate directly above the two raised parallel portions of the substrate. Additionally, the method includes removing a top surface of each of the plurality of raised portions of the substrate, the layer of the hydroscopic material on each of the plurality of raised portions of the substrate, and a top portion of the trench material. The method includes partially removing a portion of the trench material from between the two raised parallel portions of the substrate extending from the first raised portion of one of the outer edges of the substrate to the second raised portion of an opposite outer edge of the substrate where a thin layer of the trench material remains on a bottom surface of the substrate between the two raised parallel portions of the substrate and on each of a vertical surface of facing interior walls of the two raised parallel portions of the substrate. In addition, the method includes placing a float in a recessed area created from the portion of the trench material removed from between the two raised parallel portions of the substrate. The method includes bonding a rectangular component composed of a material used in the substrate to each top surfaces of the two raised parallel portions of the substrate extending from the first raised portion of one of the outer edges of the substrate to the second raised portion of an opposite outer edge of the substrate and to a top surface of two of the raised portions of the substrate along each of an outer edge of the substrate where a plurality of dimensions of the rectangular component correspond with a plurality of outer dimensions of two raised parallel portions of the substrate. The method includes bonding a cap to a top surface of the substrate and each of the plurality of circuit lines that terminate in the second end in the top edge of the substrate. Finally, the method includes bonding a component with four sides and a bottom to the outer edges of the substrate to form a reservoir.

BRIEF DESCRIPTION OF THE DRAWINGS

FIG. 16 depicts a cross-sectional view of the substrate after fabrication steps to bond a side to two raised walls of the substrate in a center area of the substrate in a process to create a liquid level sensor in accordance with an embodiment of the present invention.

FIG. 17 depicts a cross-sectional view of the substrate after fabrication steps to remove fill in a process to create a liquid level sensor in accordance with an embodiment of the present invention.

DETAILED DESCRIPTION

Figure 1:
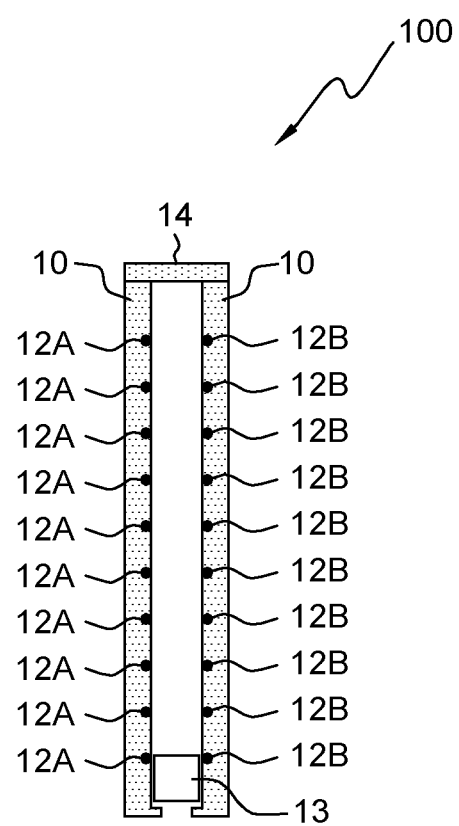
FIG. 1 depicts a cross-sectional view of a liquid level sensor in accordance with an embodiment of the present invention.

Detailed embodiments of the claimed structures and methods are disclosed herein. The method steps described below do not form a complete process flow for MEMS device manufacture, for example, using manufacturing methods for integrated circuits such as are known in the manufacture of semiconductor devices or chips. The present embodiments can be practiced in conjunction with the integrated circuit fabrication techniques or MEMS fabrication techniques currently used in the art, and only so much of the commonly practiced process steps are included as are necessary for an understanding of the described embodiments. The figures represent cross-section portions of a substrate for a sensor (e.g., used in a MEMS device or pump) during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper," "lower", "right", "left", "vertical", "horizontal", "top", "bottom", and derivatives thereof shall relate to the disclosed structures and methods, as oriented in the drawing figures. The terms "overlying," "atop," "over," "on," "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined for presentation and for illustration purposes and in some instances, may not have been described in detail. In other instances, some processing steps or operations that are known may not be described. It should be understood that the following description is rather focused on the distinctive features or elements of the various embodiments of the present invention.

Embodiments of the present invention recognize that a need to dispense precise amounts of chemicals in a micro-scale exists, particularly, in bio-medical applications. Embodiments of the present invention recognize that the need to dispense or measure exact amounts of chemicals in a micro-scale device in many applications must be robust and unaffected by movement or by liquid motion in a tank or reservoir. Embodiments of the present invention recognize that the performance of various micro-sensing devices, micro-dispensing devices, and MEMS devices such as MEMS pumps may be impacted by a build-up of biofilms or reactive agents over time. Additionally, embodiments of the present invention recognize the importance of self-cleaning in micro-sensing devices for re-use and multiple liquid use applications.

Embodiments of the present invention provide a precise, self-cleaning liquid level sensing device or sensor. Embodiments of the present invention provide a liquid level sensor that can be used in various applications and can be used in conjunction with other MEMS devices, dispensing units, or MEMS pumps. Embodiments of the present invention provide a liquid level sensor composed of a micro-tube with isolated, electrical contacts paired horizontally periodically along a vertical length of the liquid level sensor for liquid height measurement, a float, and a sensor cap with one or more electrical devices connected to the electrical contacts capable of reading changes in electrical resistance or electrical output of the paired electrical contacts when connected by a liquid in the micro-tube.

Embodiments of the present invention provide a liquid level sensor for various applications and MEMS devices where a small diameter of the narrow, micro-tube provides essentially a one-dimensional movement or vertical movement of liquid in the liquid level sensor, maintained by the float, that is protected within the micro-tube and unaffected by movement of a liquid, such as waves, in a reservoir or tank containing a liquid level sensor. Embodiments of the present invention provide an ability to measure and dispense precise and small amounts of a liquid.

Embodiments of the present invention provide re-use a liquid level sensor multiple times due to self-cleaning of the tube in the liquid level sensor containing a liquid for measurement provided based, at least in part, on a float design. Embodiments of the present invention provide self-cleaning of the micro-tube in the liquid level sensor containing a liquid for measurement provided based, at least in part, on a material selection to line the interior walls of the tube in the liquid level sensor. Embodiments of the present invention provide an ability to use more than one liquid in the liquid level sensor based on self-cleaning of the micro-tube in the liquid level sensor containing a liquid for measurement. Embodiments of the present invention provide a capability to dispense precise amounts of chemicals or liquids using one or more multiple liquid level sensors at once. Embodiments of the present invention provide an ability to measure of volume of liquid in the microliter or sub-microliter range.

Embodiments of the present invention include a micro-tube coated with a hydrophobic, non-toxic film on the micro-tube interior where a combination of the hydrophobic nature of the micro-tube coating and a movement of the float with a controlled float diameter provides a self-cleaning capability of the liquid level sensor as the float moves downward in the micro-tube. Embodiments of the present invention provide a non-conductive float capable of moving freely in the micro-tube in the liquid level sensor in response to changes in a level of a liquid in the micro-tube. Embodiments of the present invention provide an ability to determine a level of a liquid in a reservoir or a tank containing a liquid level sensor.

Embodiments of the present invention provide several float designs, materials, and a method of manufacture for both a float and a micro-tube with a hydrophobic coating for a liquid level sensor in various applications. Embodiments of the present invention provide a small, liquid level sensor capable of precise measurement of micrometer liquid level changes based on electrical signal outputs of embedded electrical contacts in a micro-tube provided to a cap on the liquid level sensor with one or more electrical devices electrically connected to the embedded electrical contacts. Embodiments of the present invention provide an accurate measure of small or microliter range of volume of a liquid where the measured small or microliter range of volume of a liquid dispensed using one or more liquid level sensors.

FIG. 1 depicts a cross-sectional view of liquid level sensor 100 in accordance with an embodiment of the present invention. As depicted, FIG. 1 includes tube 10, a plurality of electrical contacts 12A on one side of tube 10, a plurality of electrical contacts 12B on another side of tube 10, float 13, and cap 14. Each electrical contact 12A of the plurality of electrical contacts 12A aligns horizontally with a corresponding electrical contact 12B on another or opposite side of tube 10 forming an electrical contact pair. Not depicted in FIG. 1 are circuit lines connecting each of the plurality of electrical contacts 12A and each of the plurality of electrical contacts 12B to one or more electrical devices (not depicted) in cap 14.

Liquid level sensor 100 measures a height in tube 10. In various embodiments, liquid level sensor 100 measures a height or a volume of a liquid in a reservoir or tank when liquid level sensor 100 resides in the reservoir or tank. In various embodiments, a microfluidic system or microfluidic network with various devices such as micro-pumps, micro-valves, and mixing or reaction chambers utilizes measurements provided by liquid level sensor 100. In an embodiment, a MEMS implantable dosing device utilizes liquid level sensor 100. In another example, liquid level sensor 100 creates a single use miniature reagent test or a lab-on-chip requiring very small samples for detection and one or more processing devices. Similarly, liquid level sensor 100 provides use as lab-on-a-chip in yet another example. In one embodiment, one or more of liquid level sensors 100 attach to a robotic arm of a dispensing unit or mixer. While FIG. 1 depicts one embodiment of a liquid level sensor, the present invention is not limited to the form of a liquid level sensor depicted in FIG. 1.

A number of other structural forms or applications for a liquid level sensor can be provided by the present invention using the functional elements of liquid level sensor 100 (e.g., tube 10, electrical contacts 12A and 12B, float 13, and cap 14). Examples of other forms of a liquid sensor provided by the present invention include at least the forms or embodiments of a liquid level sensor presented in FIG. 2 and FIG. 3 as well as those discussed above.

In various embodiments, tube 10 is a micro-scale, rectangular or square tube that includes a plurality of electrical contacts 12A, a plurality of electrical contacts 12B, and circuit elements or circuit lines (not depicted in FIG. 1) connecting each of electrical contacts 12A and each of electrical contacts 12B to cap 14. For example, interior dimensions of tube 10 range from five micrometers to several millimeters in the x-axis and y-axis (e.g., horizontal dimensions) and several hundred micrometers to several centimeters in length (e.g., vertical direction of tube 10), but are not limited to these dimensions. The specific dimensions of tube 10 can be determined by the application or targeted end-use of liquid level sensor 100. In various embodiments, a determination of a design of tube 10 includes a determination of tube 10 interior dimensions, a determination a type of material coating in the interior of tube 10, and a determination of spacing of electrical contacts 12A and 12B based, at least in part, on modelling tube 10 capillary action, liquids to be measured for height in tube 10 by liquid level sensor 100, float buoyant forces, a precision required for a measurement of changes in a height of a liquid, and air pressure effects if applicable (e.g., if a closed tube 10 without airflow in liquid level sensor 100). In various embodiments, the bottom of tube 10 includes small protrusions, a ring, a ledge, or other similar stop present in the bottom of tube 10 preventing float 13 from leaving or dropping out of the bottom opening of tube 10 when liquids are not present (e.g., to hold float 13 in tube 10).

In an embodiment, tube 10 is a triangular or circular shaped tube with vertically spaced electrical contacts embedded parallel to each other in two sides or two areas running from bottom to top of tube 10. For example, shadow-masking photolithography can be used to create a triangular shaped tube 10 while a nano-impression technique can be used to create circular shaped tube 10 (e.g., when two circular impressions are bonded together forming a circular tube).

In various embodiments, tube 10 is associated with or inside a reservoir or larger liquid containing element where tube 10 is built into a wall of the reservoir or is positioned and stabilized in the reservoir. For example, struts or mechanical supports stabilize tube 10 in a reservoir in order measure a level of a liquid in the reservoir or tank. In an embodiment, tube 10 is used as a micro-needle or micro-dispense mechanism upon completion of liquid level sensor 100. In one embodiment, tube 10 attaches to a dispensing unit or mixing unit, for example, by a robotic arm.

In various embodiments, tube 10 is composed of a typical handle material used for microfluidic MEMS devices. In various embodiments, tube 10 can be composed of a dielectric material or electrically insulating material with structural and properties capable of forming embedded electrical contacts or resistive elements, circuit lines connecting electrical contacts 12A and 12B with one or more electrical devices. For example, tube 10 is composed of poly methyl methacrylate (PMMA) material, polycarbonate (PC) material, or other similar plastic material that provides good rigidity and is capable of being processed using known micro-machining, nano-impression, 3-D printing, MEMS, or semiconductor manufacturing processes. In an embodiment, a semiconductor material or a layered semiconductor material, such as a semiconductor-on-insulator material composes tube 10.

In various embodiments, a hydrophobic material such as a polydimethylsiloxane (PDMS) material covers the interior walls of tube 10. A hydrophobic material may be determined based on the hydrophobicity of a flat surface. The hydrophobicity can be measured by the contact angle of water droplet on a flat surface of the material where a higher contact angle of the water on the surface of the material is higher hydrophobicity (i.e., the material is more hydrophobic). The use of a hydrophobic coating on the interior of tube 10 in conjunction with a downward movement of float 13 as a liquid level drops (e.g., when liquids exit tube 10) provide a self-cleaning action in liquid level sensor 100. A surface resistant or hydrophobic to liquids creates a large contact angle of a liquid with the interior surface of tube 10. The larger contact angle of the liquid with the interior surface of tube 10 provides easier removal of any remaining liquid or residual films in tube 10 by float 13 downward movement.

In various embodiments, a plurality of electrical contacts 12A formed in one inner surface or side of tube 10 and a plurality of electrical contacts 12B formed in another or an opposite side of tube 10 are horizontally aligned in pairs with each other (e.g., each electrical contact 12A has an electrical contact 12B parallel to it). As fabricated in tube 10, electrical contacts 12A are electrically isolated from electrical contacts 12B. Electrical contacts 12A and 12B can be composed of metals or conductive material used in circuit line or circuit device formation. For example, electrical contacts 12A and 12B formed by semiconductor device fabrication processes patterning/lithography, etching, and deposition methods for copper circuit lines. In an embodiment, electrical contacts 12A and 12B are resistive elements exposed on one or more inner surfaces of tube 10 (e.g., on opposite sides of tube 10). In tube 10, circuit lines (not depicted in FIG. 1) connect each of electrical contacts 12A and 12B with cap 14.

In an end use of a liquid level sensor 100 to measure a height of a liquid, electrical contacts 12A and 12B not in contact with the liquid remain open or without electrical connection. As a conductive liquid fills tube 10, each of electrical contacts 12A in the liquid electrically connect with an associated electrical contact 12B in the electrical pair of contacts horizontally aligned in tube 10. In various embodiments, each of electrical contacts 12A and each of electrical contacts 12B electrically connected by the liquid in tube 10 provide electrical inputs to one or more electrical devices in cap 14.

In liquid level sensor 100, the spacing of electrical contacts 12A and 12B in tube 10 determine, at least in part, the precision of the measurement of a height of a liquid in tube 10. A more precise measurement of the liquid height is provided by liquid level sensor 100 when the spacing between each of electrical contacts 12A and each of electrical contacts 12B is minimized (i.e., the closer the electrical contacts on each side of tube 10 are, the more precise the liquid height measurement). For example, when the fabrication of electrical contacts 12A and 12B occurs using semiconductor manufacturing processes (e.g., lithography patterning, etching, and deposition processes), electrical contacts 12A and electrical contacts 12B on each side of tube 10 can be very close (e.g., within ten nanometers or less). In various embodiments, formation of electrical contacts 12A and 12B in liquid level sensor 100 using semiconductor manufacturing processes provides an ability for very accurate or precise measurements of a liquid height in tube 10. Additionally, narrower dimensions for the interior of tube 10 improve the precision of a measurement of a volume of a liquid in liquid level sensor 100.

Float 13 is composed of a buoyant material capable of floating on a liquid entering tube 10. In various embodiments, float 13 dimensions (e.g., in a horizontal or x-y axis) correspond to tube 10 inner diameter. For example, float 13 dimensions are less than or one to ten percent less than dimensions of the interior walls of tube 10 allowing float 13 to move freely up and down in tube 10 in response to changing liquid levels in tube 10 while still providing self-cleaning of tube 10. A diameter of float 13 can be determined based, at least in part, on tube 10 diameter, the liquids to be measured, a material selection for float 13 and a material coating the interior walls of tube 10, and the various manufacturing or fabrication processes used to form float 13.

As a liquid level abates or lowers and tube 10 empties, the dimensions of float 13 provide contact or a limited contact with the interior walls of tube 10 while allowing float 13 to move up and down in tube 10 in response to changes in the level of liquid in tube 10. In an embodiment, float 13 horizontal or x and y dimensions are 0.3 micrometers to several millimeters less than the horizontal or x and y dimensions of tube 10 interior or inner dimensions. In various embodiments, a low density, dielectric material composes a portion of float 13 to provide buoyancy of float 13. For example, float 13 uses a low density, low-k dielectric constant material such as a xerogel. A xerogel is a material formed from a gel after the removal of swelling agents (e.g., silica gel dried with swelling agents removed). A xerogel material provides a low density, dielectric material capable of floating on various liquids.

In various embodiments, a coating on float 13 provides protection for the buoyant material (e.g., xerogel) during liquid level sensor 100 fabrication and use. For example, a nitride, or other similar material resistant to etchants during liquid level sensor 100 fabrication and resistant to other liquids potentially damaging to the buoyant material of float 13 during operation or use in an end-use application. A coating on float 13 can prevent liquid penetration of float 13. For example, a protective coating, such as a nitride protective coating (not depicted in FIG. 1), enclosing or around the xerogel material of float 13, protects xerogel material in float 13 against the wet acid release process during formation of liquid level sensor 100, as discussed in detail later with respect to FIG. 17. Additionally, a protective coating, such as a nitride coating of float 13, provides additional mechanical rigidity to float 13.

In an embodiment, a material for improved movement of float 13 in tube 10 coats the exterior of float 13 (e.g., a material providing a smoother surface for reduced friction within tube 10) or a material repelling/resisting liquids (e.g., a hydrophobic material) for improved self-cleaning coats float 13. In one embodiment, float 13 includes holes or channels between a bottom surface of float 13 and a top of float 13 for improved pressure differentials created above and below float 13. In various embodiments, float 13 incorporates rounded corners and one or more sides with scalloped edges or removed material that reduces contact one or more interior walls of tube 10 to reduce friction with interior wall of tube 10. A float design using various design elements, such as scalloped edges, is discussed later with respect to FIG. 21.

In various embodiments, the formation of float 13 occurs within tube 10 (e.g., in-situ) using known mechanical fabrication techniques for MEMS devices or by semiconductor manufacturing processes during fabrication of tube 10 and liquid level sensor 100. In an embodiment, float 13, formed outside of tube 10 or separately from tube 10 using known micro-device fabrication processes and/or known semiconductor fabrication processes, is placed within tube 10 before completing liquid level sensor 100 upon completion of float 13.

Cap 14 is depicted on the top of tube 10 in FIG. 1. In various embodiments, cap 14 includes one or more electrical devices. For example, the one or more electrical devices can be a power source, one or more electrical devices connected to the plurality of electrical contacts 12A and 12B for measuring an electrical output from electrical contacts 12A and 12B when horizontally aligned electrical contacts 12A and 12B are electrically connected by a liquid, other electrical devices and/or logical functions for signal processing and communication (e.g., devices for Wi-Fi support, providing wireless protocol for monitoring sensor data, etc.). In various embodiments, cap 14 includes one or more electrical devices directly connected to each pair of electrical contacts 12A and 12B in order to read electrical signals or output created when a liquid completes a connection between associated or aligned electrical contacts 12A and 12B in an electrical pair. For example, an electrical device such as a MUX device can read changes in the electrical signals or output occurring as a liquid rises creating additional immersed or electrically connected pairs of electrical contacts 12A and 12B used to determine a liquid level. In one embodiment, one or more devices connected to each of the plurality of electrical contacts 12A and 12B include a MUX connected to an A/D converter connected to a microcontroller or other similar control circuitry. The one or more devices in cap 14 can provide both DC sensing where non-polar molecules are unaffected by an electric field, as well as AC sensing, to determine circuit properties (e.g., resistive, inductive, capacitive properties of tube 10 considering electrical contacts 12A and 12B, the liquid, the space above float 13, and float 13). In an embodiment, a calibration of the devices in cap 14 with respect to a location of electrical contacts 12A and 12B, float 13 size, float 13 materials, tube 10 design and tube 10 material selection provides for accurate liquid height measurements.

In various embodiments, cap 14 includes one or more holes or channels (not depicted in FIG. 1) for airflow between tube 10 and an external environment such as a reservoir. In one embodiment, cap 14 does not completely cover an inner dimension of tube 10. For example, cap 14 may not extend to a back interior wall of tube 10 or otherwise leave an opening between the interior of tube 10 and an external environment above or outside of cap 14. In one embodiment, cap 14 does not provide holes or an offset with respect to tube 10 for airflow into and out of tube 10 in response to a liquid level changes but, instead, one or more holes or channels for airflow are provided in a top of a side of tube 10. In an embodiment, cap 14 or tube 10 do not need openings or channels for airflow. For example, modeling shows that a sealed liquid level sensor 100 (e.g., with a sealed tube without airflow openings in either cap 14 and tube 10) with under certain dimensions of tube 10 with various liquids and a solid float 13 have minimum pressure related downward forces at the micro scale level while force diagrams show the buoyant force as a dominant factor in the motion of float 13.

In one embodiment, cap 14 resides at the bottom of tube 10 (not depicted in FIG. 1). For example, cap 14 covers a portion of the bottom of tube 10 or covers the bottom of tube 10 while a portion of one or more sides of tube 10 do not extend down to cap 14, thus providing a channel or opening to the bottom of tube 10 for liquid entry into tube 10. For example, cap 14 including one or more electrical devices reside on the bottom of tube 10 and is electrically connected to each of electrical contacts 12A and 12B and tube 10. In an embodiment, when cap 14 resides at the bottom of tube 10, tube 10 is open on top, partially covered, or has one or more openings for an airflow channel between an interior of tube 10 and exterior area (e.g., outside of tube 10).

In various embodiments, cap 14 is fabricated separately from tube 10. For example, cap 14 can be fabricated separately from the fabrication of tube 10 by known semiconductor device manufacturing processes. In various embodiments, cap 14 can be bonded to tube 10 with various conductive adhesive bonding or wafer bonding techniques to provide electrical connections from electrical contacts 12A and 12B to circuit lines 78 (not depicted in FIG. 1) connecting one or more electrical devices in cap 14.

In one embodiment, liquid level sensor 100 provides a precise, pre-determined volume of a liquid. For example, when devices in cap 14 determine that a liquid level in tube 10 is at a desired height, the openings or holes (not depicted) in cap 14 are covered by a non-permeable membrane, a MEMS valve, or a lid (not depicted). Covering or closing openings or airflow channels to tube 10 prevents release of a liquid in tube 10. Covering or closing openings for airflow in or out of tube 10 holds the precise, pre-determined volume of the liquid in tube 10. An opening or removal of a non-permeable membrane, a MEMS valve, or a lid allows release or dispensing of the precise, pre-determined volume of the liquid from tube 10. For example, after the non-permeable membrane or lid releases from cap 14, liquid level sensor 100 dispenses the liquid directly below tube 10. In some embodiments, one or more of liquid level sensors 100 are moved to another location to dispense the liquid, for example using an automated dispensing unit. A precise volume of liquid, medicine, or reagents can be deposited directly to a location such as an area on a patient or to a component mixer (not depicted in FIG. 1) when the non-permeable membrane or lid is removed from cap 14 or the top of tube 10.

In an embodiment, one or more of liquid level sensors 100 are mounted on a robotic arm or an automated mixing machine (not depicted in FIG. 1) that dispenses a measured volume of a liquid and moves from a first liquid to a second, different liquid or reagent. In various embodiments, a self-cleaning of tube 10 using float 13 in liquid level sensor 100 provides the ability for multiple uses or dispenses of a liquid. Additionally, self-cleaning of tube 10 provided by float 13 and in some embodiments, assisted by a use of a hydrophobic material in tube 10 allows liquid level sensor 100 to be used with more than one liquid.

Figure 2:
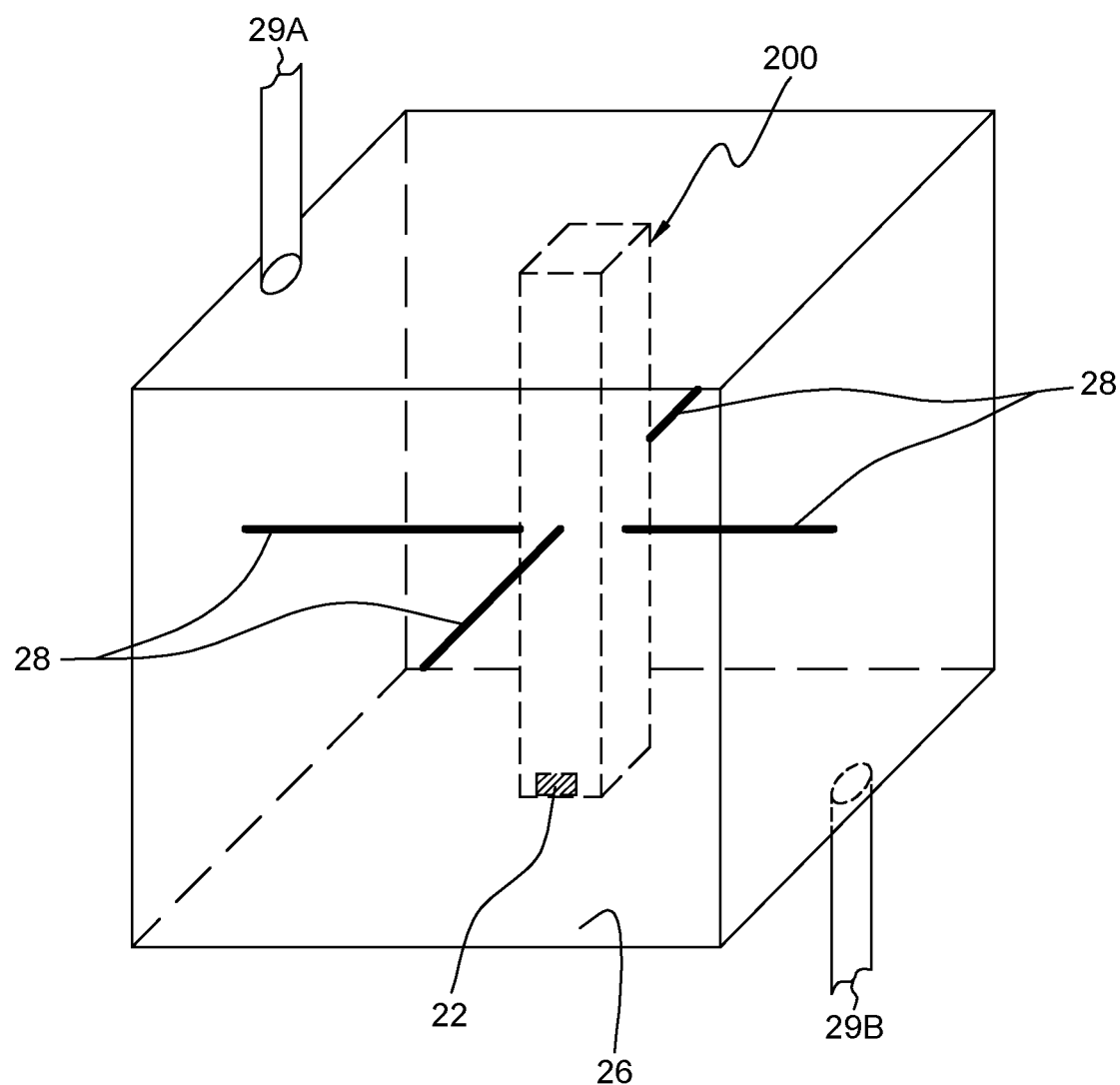
FIG. 2 depicts a three-dimensional schematic drawing of a liquid level sensor suspended in a reservoir in accordance with an embodiment of the present invention.

FIG. 2 depicts a three-dimensional schematic drawing of liquid level sensor 200 suspended in reservoir 26 in accordance with an embodiment of the present invention. As depicted, FIG. 2 includes liquid level sensor 200 with sensor liquid inlet 22, reservoir 26 schematically depicted by interior walls of reservoir 26, four supports 28, reservoir inlet 29A, and reservoir outlet 29B. Liquid level sensor 200 includes the various functional elements (not depicted in FIG. 2) of a liquid level sensor such as a tube, a float, a cap, and a plurality of electrical contacts (e.g., electrical contacts 12A and 12B) electrically connected to the cap with electrical devices (e.g., cap 14 in FIG. 1) as discussed in detail with respect to FIG. 1. In FIG. 2, liquid level sensor 200 illustrates an opening or sensor liquid inlet 22 allowing liquids from reservoir 26 to enter and exit liquid level sensor 200 in response to changes in the liquid level in reservoir 20. Additionally, inlet 29A and outlet 29B provide liquid entry and exit from reservoir 26. A location and shape of sensor liquid inlets 22, inlets 29A, and outlets 29B are not limited to locations or shapes depicted in FIG. 2.

Liquid level sensor 200 is located and stabilized in reservoir 26 by four supports 28. While depicted as four supports 28 attaching liquid level sensor 200 to the four walls of reservoir 26, in other embodiments, one or more supports 28 can attach liquid level sensor 200 to one or more walls or another interior surface of reservoir 26. In various embodiments, supports 28 are formed in a separate fabrication process and bonded to liquid level sensor 200 by known wafer bonding techniques or other suitable bonding processes with an appropriate adhesive (e.g., impervious to liquids in reservoir 26). For example, supports 28 fabrication can occur by micro-machining, 3-D printing, semiconductor manufacturing processes, or the like. In an embodiment, formation of supports 28 occurs during fabrication of liquid level sensor 200. In various embodiments, supports 28 are composed of a handling material such as used for tube 10 in liquid level sensor 100 fabrication however; supports 28 are not limited to these materials. Supports 28 can be one or more struts, beams, or other similar structural element created with any material providing adequate strength to stabilize or support and hold liquid level sensor 200 in reservoir 26. Additionally, supports 28 material has an ability to bond to reservoir 26 and tube 10.

Supports 28 stabilize and maintain the position of liquid level sensor 100 in reservoir 26. When disturbances to a liquid in reservoir 26 (e.g., waves) occur, supports 28 hold liquid level sensor 100 in position relative to reservoir 26 walls. While stabilized in reservoir 26, liquid level sensor 200 is unaffected by disturbances of the liquid in reservoir 26 since tube 10 in liquid level sensor 200 provides protection from waves in reservoir 26 (i.e., tube 10 prevents erroneous liquid level data or readings due reservoir 26 liquid disturbances).

Figure 3:
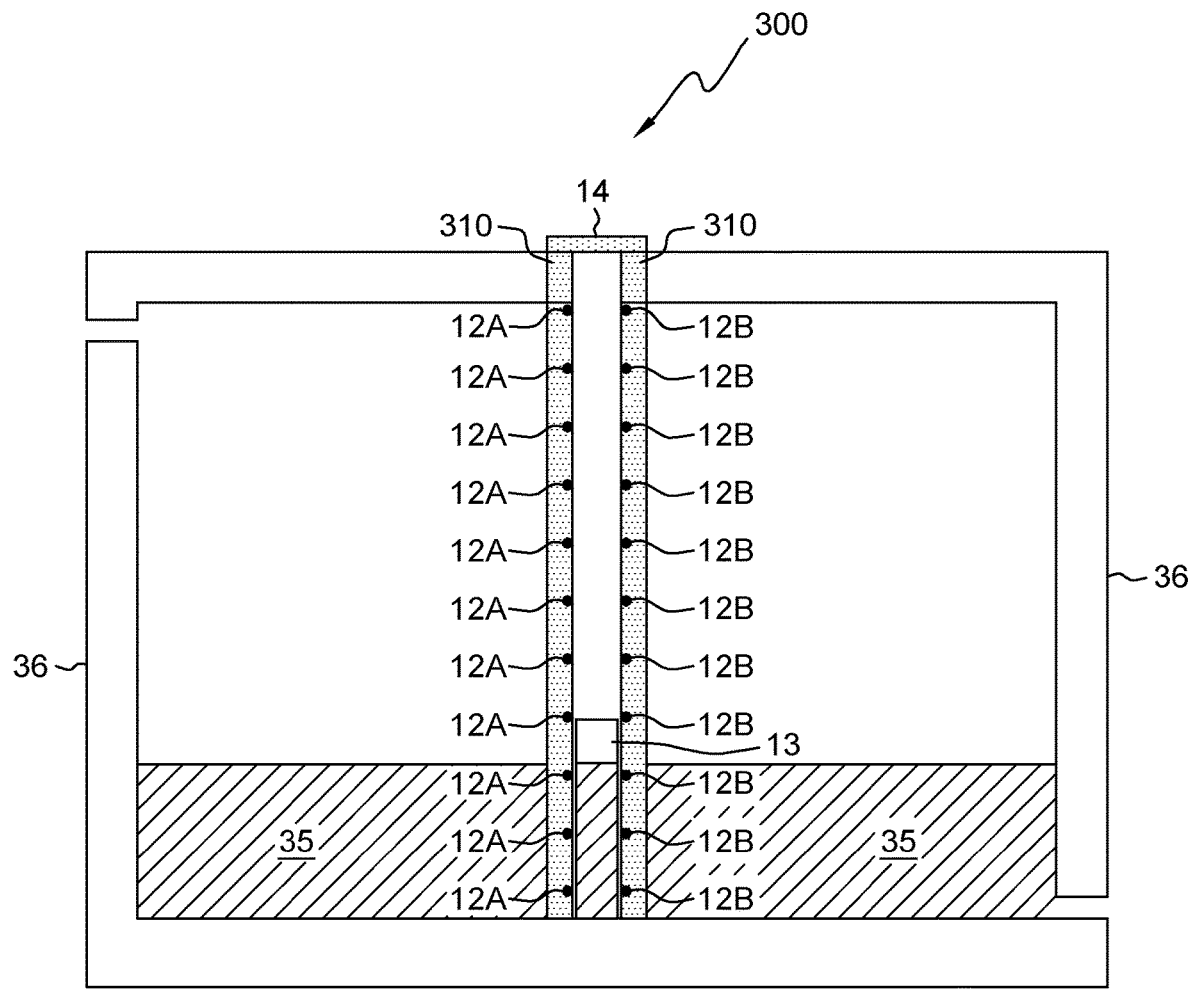
FIG. 3 depicts a cross-sectional view of a liquid level sensor built into a wall of a reservoir in accordance with an embodiment of the present invention.

FIG. 3 depicts a cross-sectional view of liquid level sensor 300 built into a wall of reservoir 36 in accordance with an embodiment of the present invention. As depicted, FIG. 3 includes liquid level sensor 300 with a plurality of electrical contacts 12A and a plurality of electrical contacts 12B in tube 310, each aligned horizontally in a pair of electrical contacts 12A and 12B, float 13, cap 14, liquid 35, and reservoir 36. While depicted as liquid level sensor 300 in a center of one of the walls of reservoir 36, the location of liquid level sensor 300 is not limited to this location and more than one liquid level sensor 300 can be formed in one or more walls of reservoir 36.

Tube 310 fills with liquid 35 to a level or height corresponding to a level or height of liquid 35 in reservoir 36. Tube 310 provides essentially the same functionality of tube 10 in FIG. 1 but is attached to the walls of reservoir 36 by supports 28 while extending to the bottom of reservoir 36. Tube 310 does not have a bottom ring or shelf to maintain float 13 in tube 310. Float 13 rises to a level corresponding to the height of liquid 35 in reservoir 36. Electrical contacts 12A and 12B above the bottom of float 13 (e.g., when float 13 is composed of a non-conductive material) are not in liquid 35 and are open. As shown, three pairs of electrical contacts 12A and 12B are submerged in liquid 35. The three submerged pairs of electrical contacts 12A and 12B are electrically connected or shorted by liquid 35. The submerged pairs of electrical contacts 12A and 12B provide an electrical output or signal to one or more electrical devices in cap 14. The electrical outputs or signals provided by shorted electrical contacts 12A and 12B are used by the one or more electrical devices in cap 14 to determine a level or height of liquid 35 in tube 310. As a level of liquid 35 drops in reservoir 36 and correspondingly in tube 310, one or more aligned pairs of electrical contacts 12A and 12B are no longer electrically connected, therefore changing the electrical output sent to the one or more electrical devices in cap 14. A lower level of liquid 35 in reservoir 36 is indicated by the electrical output or signals received by one or more devices in cap 14 as the level of liquid 35 in reservoir 36 drops.

In various embodiments, liquid level sensor 300 is fabricated out of a substrate and is on a wall of reservoir 36. Liquid level sensor 300 includes the functional elements, as depicted in FIG. 3, including float 13, cap 14, tube 310 with electrical contacts 12A and 12B. Float 13 and cap 14 are the same as functional elements as described with respect to FIG. 1. Tube 310 with electrical contacts 12A and 12B is essentially the same or similar to tube 10 in FIG. 1. A method to build or fabricate liquid level sensor 300 is depicted in FIGS. 4-19. The various fabrication processes used to create liquid level sensor 300, embedded in a wall of reservoir 36, are discussed below in detail with respect to FIGS. 4-19.

Figure 4:
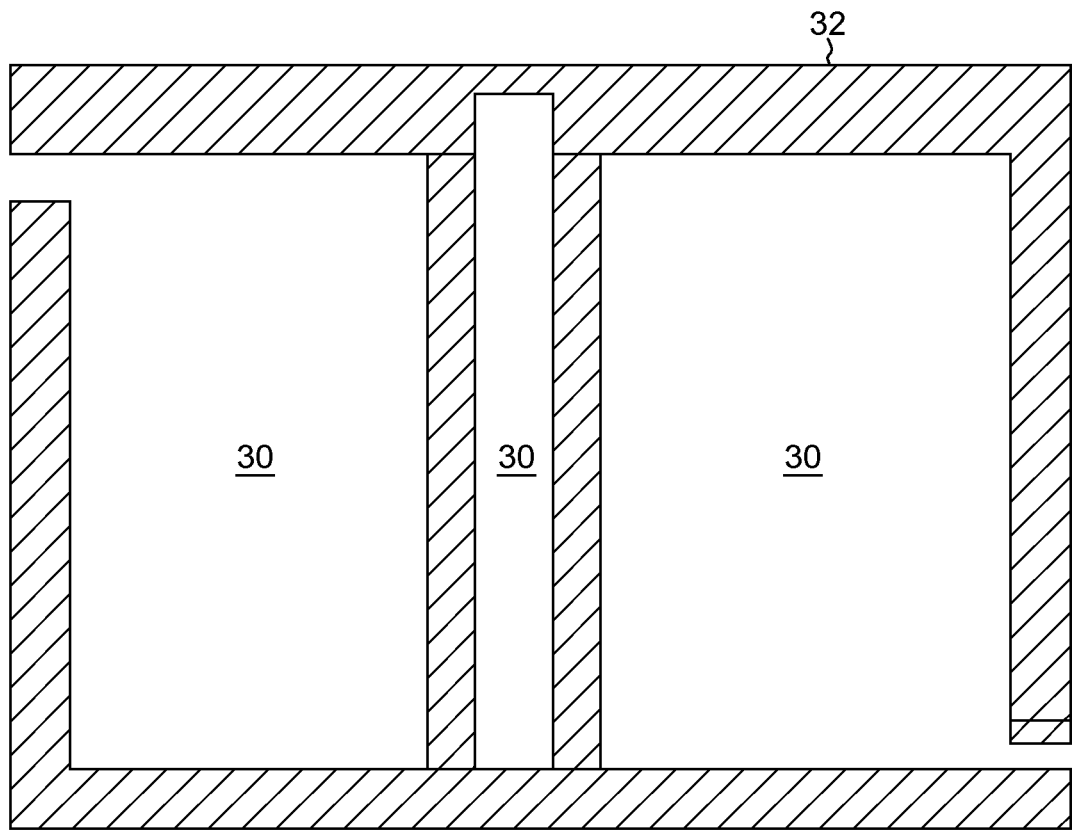
FIG. 4 depicts a top down view of a substrate after fabrication steps to deposit and pattern resist on the substrate in a process to create a liquid level sensor in accordance with an embodiment of the present invention.

FIG. 4 depicts a top down view of substrate 30 after fabrication steps to deposit and pattern resist 32 on substrate 30 in a process to create liquid level sensor 300 in accordance with an embodiment of the present invention. As depicted, FIG. 4 includes substrate 30 with resist 32 patterned on substrate 30. In various embodiments, substrate 30 is composed of a material used in the fabrication of microfluidic MEMS devices. Substrate 30 can be composed of one or more materials compatible with standard semiconductor manufacturing or MEMS device manufacturing processes. For example, substrate 30 is composed of PMMA or PC. Both PMMA and PC provide sufficient rigidity, ability for patterning, and compatibility with chemical processes for patterning, etching, and deposition of materials needed to fabricate liquid level sensor 100. Substrate 30 is not limited to PMMA or PC, but may be composed of other materials commonly used in MEMS and semiconductor devices (e.g., other non-conductive materials/plastics, semiconductor materials, oxides, etc.).

In various embodiments, a size of substrate 30 is determined by an end-use application of liquid level sensor 300. For example, a larger substrate 30 is required for a larger reservoir. For example, substrate 30 to create a reservoir may have horizontal or x and y dimensions from 50 micrometers to several centimeters depending on the application. Substrate 30 is depicted with resist 32 patterning two legs or vertical elements in the center area of substrate 30 (e.g., the two legs will form tube 310 of liquid level sensor 300 upon completion of liquid level sensor 300 fabrication). In an embodiment, resist 32 patterning the two vertical elements in the center of substrate does not extend to resist 32 patterned horizontally along the bottom edge of substrate 30 (e.g., provides an opening in tube 310 of completed liquid level sensor 300 when complete).

As depicted in FIG. 4, in various embodiments, resist 32 along outer edges of substrate 30 includes two openings in resist 32. The two openings will create channels for fluid intake and outlet in the reservoir. The position of the openings in resist 32 along the edges of substrate 30 are not limited to the depicted positions (e.g., upper left corner of substrate 30 and lower right corner of substrate 30 as depicted in FIG. 4). In other embodiments, one or more openings and one or more different positions of openings in resist 32 occurs. In an embodiment, resist 32 is not present in the top center notched or thin area of resist 32 is not present.

Figure 5:
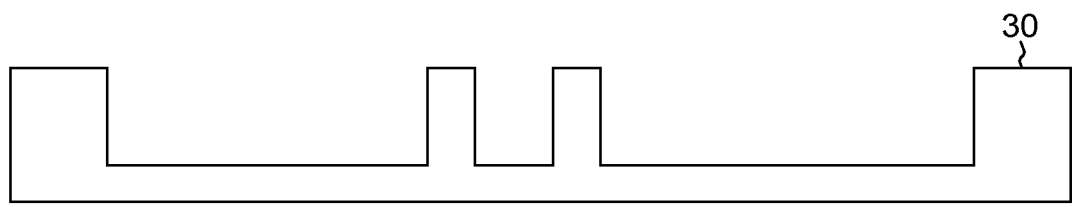
FIG. 5 depicts a cross-sectional view of the substrate after fabrication steps to remove a portion of the substrate in a process in a process to create a liquid level sensor in accordance with an embodiment of the present invention.

FIG. 5 depicts a cross-sectional view of substrate 30 after fabrication steps to remove a portion of substrate 30 in a process in a process to create liquid level sensor 300 in accordance with an embodiment of the present invention. As depicted, FIG. 5 includes substrate 30 after an etch process to partially remove the portions of substrate 30. In an embodiment, using a wet or a dry etch process, the portions of substrate 30 not covered by resist 32 are partially removed. For example, using a reactive ion etch (RIE) of substrate 30 removes a top layer of substrate 30 and leaves a remaining portion of substrate 30 with a pre-determined thickness (e.g., ten micrometers to several millimeters). The thickness of the remaining portion of substrate 30, not covered by resist 32 in FIG. 4, is controlled by the etching process and is pre-determined based, at least in part, on handling requirements for substrate 30 through fabrication and/or end-use requirements of the application of liquid level sensor 300.

Figure 6:
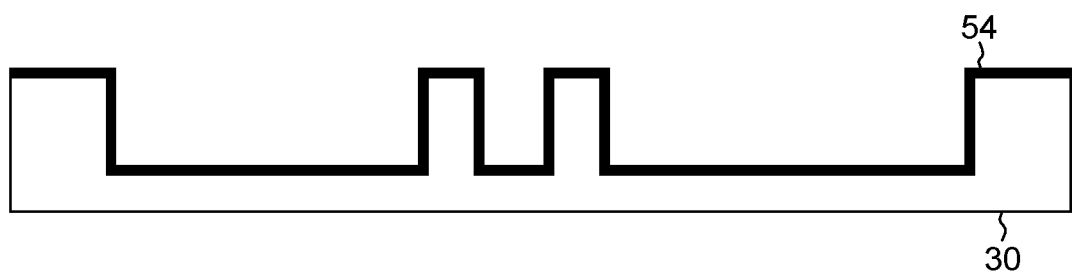
FIG. 6 depicts a cross-sectional view of the substrate after fabrication steps to deposit a material for a liner in a process to create a liquid level sensor in accordance with an embodiment of the present invention.

FIG. 6 depicts a cross-sectional view of substrate 30 after fabrication steps to deposit a material for liner 54 in a process to create liquid level sensor 300 in accordance with an embodiment of the present invention. As depicted, FIG. 6 includes substrate 30 and liner 54. In various embodiments, liner 54 is a layer or several layers of a hydrophobic material. For example, the layer of hydrophobic material deposited by a deposition method, such as chemical vapor deposition (CVD), physical vapor deposition (PVD), atomic layer deposition (ALD), creates liner 54. In an embodiment, liner 54 is composed of PDMS deposited by CVD on the top surface of substrate 30. A thickness of liner 54 can range from several nanometers to fifty micrometers although the thickness is not limited to this range. In an embodiment, liner 54 is composed of a non-conductive material with a low co-efficient of friction. In one embodiment, a deposition of liner 54 in tube 310 does not occur (e.g., a hydrophobic material is not present or deposited).

Figure 7:
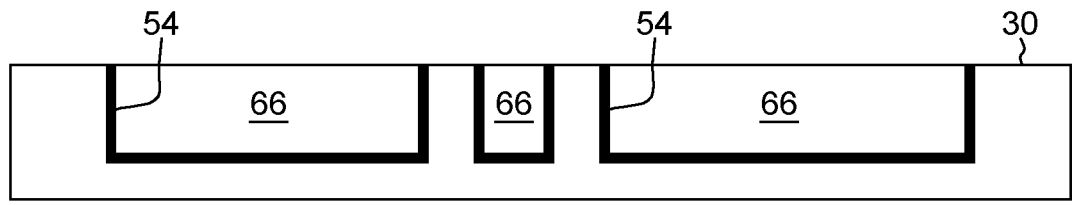
FIG. 7 depicts a cross-sectional view of the substrate after fabrication steps to deposit a material for trench fill and planarization in a process to create a liquid level sensor in accordance with an embodiment of the present invention.

FIG. 7 depicts a cross-sectional view of substrate 30 after fabrication steps to deposit fill 66 for trench fill and after planarization in a process to create liquid level sensor 300 in accordance with an embodiment of the present invention. As depicted, FIG. 6 includes substrate 30, liner 54, and fill 66 after fill 66 is deposited and planarized.

In various embodiments, a deposition of fill 66 composed of a trench fill material replaces the partially removed portions of substrate 30 on liner 54. Deposition of fill 66, which may be an oxide material or other suitable trench material, can occur by known processes such as CVD, PVD, ALD, or the like. In an embodiment, fill 66 is SiO2. After deposition of fill 66, a planarization of substrate 30 and fill 66 removes a top surface of as deposited fill 66, a top surface of substrate 30, and liner 54 on the raised portions of substrate 30 that were not removed in previous etch process. Planarization of the top surface of substrate 30 and the top surface of fill 66 can occur by chemical mechanical polishing (CMP) or other similar process. A thickness of substrate 30 and substrate 30 with fill 66 and liner 54 after planarization is dependent, at least in part, on handling requirements of substrate 30 and a design of liquid level sensor 300 for an end-use application. For example, substrate 30 may be thin in a very small reservoir.

Figure 8:
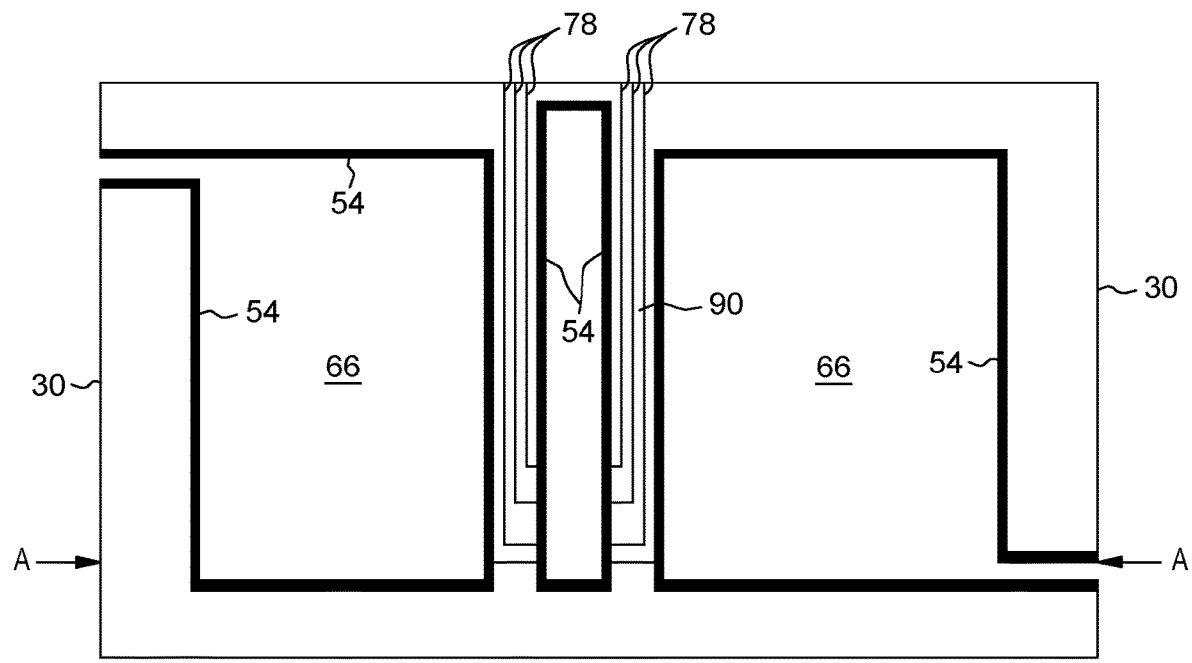
FIG. 8 depicts a top down view of the substrate after fabrication steps to pattern and deposit circuit lines on a portion of the substrate in a process in a process to create a liquid level sensor in accordance with an embodiment of the present invention.

FIG. 8 depicts a top down view of substrate 30 after fabrication steps to pattern and deposit circuit lines 78 on a portion of substrate 30 in a process to create liquid level sensor 300 in accordance with an embodiment of the present invention. As depicted, FIG. 8 includes substrate 30, liner 54, fill 66, and circuit lines 78 where the number of circuit lines 78 is determined based, at least in part, on the granularity or precision required for liquid level measurement by liquid level sensor 300 after completion of sensor fabrication. In various embodiments, semiconductor manufacture processes for lithography patterning, etch, and metal deposition create circuit lines 78, although, other processes such as micromachining, polymer heat vacuum forming, 3-D printing, and the like can be used to form circuit lines 78.

The circuit lines 78 are formed that terminate in one end on the facing interior sides of the two raised portions of substrate 30 extending vertically through the center portion of substrate 30 and terminate at the other end at the top surface of substrate 30 as depicted. For simplification and readability, hereafter the facing interior sides of the two raised portions of substrate 30 extending vertically through the center portion of substrate 30 will be called the sides of tube 310 and tube 310 is as depicted in FIG. 3. When circuit lines 78 terminate with a closer spacing on the facing interior sides of the sides of tube 310, a more granular or precise measurement of a liquid level may be attained by liquid level sensor 300 upon completion of the sensor fabrication. In various embodiments, a determination of the number of pairs of aligned circuit lines 78 terminating on the inside of the sides of tube 310 and passing through liner 54 is based, at least in part, on the application. Additionally, the granularity of the measurements of a liquid level or a liquid volume can be improved with a taller, narrow design of a tube for liquid level sensor 300 versus a shorter, wider tube for liquid level sensor 300.

In various embodiments, the ends of circuit lines 78 that terminate with a uniform, periodic spacing on facing interior sides of the sides of tube 310 form electrical contacts 12A and 12B in FIG. 3. In an embodiment, the ends of circuit lines 78 (e.g., forming electrical contacts 12A and 12B in FIG. 3) have a non-linear spacing. For example, a logarithmic scale determines the spacing of the ends of circuit lines 78 in the sides of tube 310. In another example, the spacing of the ends of circuit lines 78 in the sides of tube 310 provide a higher density in the middle and lower part of the sides of tube 310. A higher density of circuit lines 78 terminating on the sides of tube 310 in the middle portion and the lower portion of the sides of tube 310 will provide a more precise reading of a liquid level in the middle region and bottom region of liquid level sensor 300 upon completion of fabrication of the sensor. In one embodiment, a spacing of the ends of circuit lines 78 provides a measurement of equal volumes in a complex tank (e.g., a gas tank in a car or in other complexly shaped tank).

A size and shape of a termination of circuit lines 78, in addition to the spacing of the termination of circuit lines 78 (discussed above) can be determined based, at least in part, on the end-use or application of liquid level sensor 300 (e.g., for more precision, more circuit lines 78 terminate closer for electrical contacts 12A and 12B). A width of the two sides of tube 310 can be increased when more circuit lines 78 are needed.

In various embodiments, a metal such as copper forms circuit lines 78. Semiconductor device manufacturing processes such as resist apply, lithography patterning, and metal deposition create circuit lines 78 in various embodiments. Known lithography techniques and deposition methods such as ALD, CVD, PVD, and the like can achieve very small circuit line 78 spacing (e.g., in less than the ten nanometer range).

Figure 9:
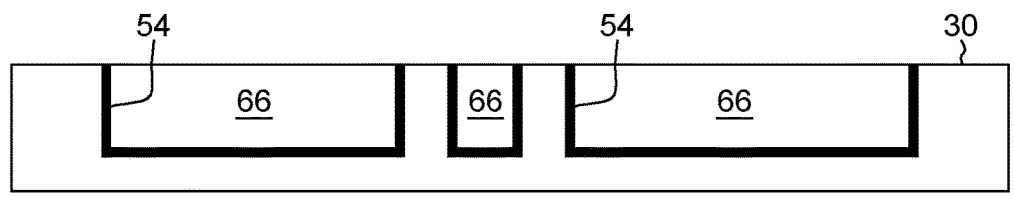
FIG. 9 depicts a cross-sectional view of the substrate after fabrication steps to from circuit lines on the substrate in a process to create a liquid level sensor in accordance with an embodiment of the present invention.

FIG. 9 depicts a cross-sectional view of substrate 30 after fabrication steps to from circuit lines 78 on substrate 30 in a process to create liquid level sensor 300 in accordance with an embodiment of the present invention. As depicted, FIG. 9 includes substrate 30, liner 54, and fill 66 where the location of the cross-section of liquid level sensor 300 in reservoir 36 is depicted by the arrows in FIG. 8. The cross-section A-A does not go through circuit lines 78.

Figure 10:
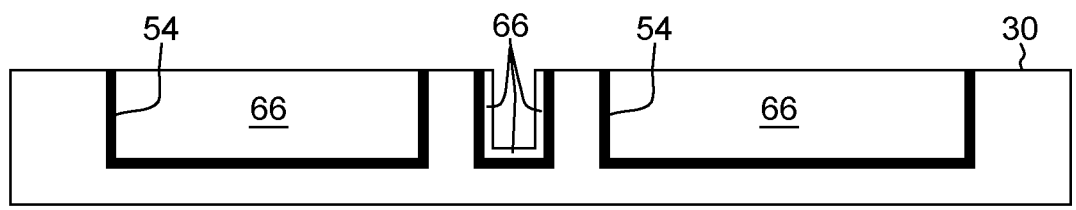
FIG. 10 depicts a cross-sectional view of the substrate after fabrication steps selectively removing a portion of fill in a process to create a liquid level sensor in accordance with an embodiment of the present invention.

FIG. 10 depicts a cross-sectional view of substrate 30 after fabrication steps selectively removing a portion of fill 66 in a process to create liquid level sensor 300 in accordance with an embodiment of the present invention. In various embodiments, after standard resist apply and lithography patterning, one or more wet or dry etch processes selectively and partially removes a portion of fill 66 between the two sides of tube 310. For example, a RIE of fill 66 partially removes a rectangular portion fill 66 associated with a size of float 13 in FIG. 3. After etching, a very thin layer of fill 66 remains under the partially removed portion of fill 66 and a very thin layer of fill 66 remains along the vertical sides of the two sides of tube 310 over liner 54. The very thin layer of fill 66 remaining under the partially removed portion of fill 66 and remaining along the vertical sides of the two sides of tube 310 on liner 54 can be determined based, at least in part, on design considerations for a release of the float (e.g., float 13) in subsequent steps of liquid level sensor 300 fabrication and by design considerations for the float x and y dimensions (e.g., horizontal dimensions for float width) to provide self-cleaning of liquid level sensor 300. An amount of fill 66 partially removed is determined based, at least in part, on modelling of the tube and the float to determine a float height. In various embodiments, after removal of fill 66, a planarization of substrate 30, liner 54, and remaining fill 66 occurs, for example, by CMP.

Figure 11:
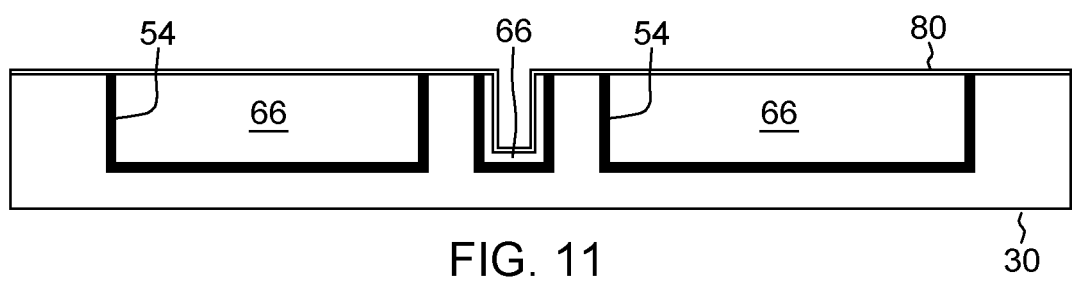
FIG. 11 depicts a cross-sectional view of the substrate after fabrication steps to deposit a liner in a process to create a liquid level sensor in accordance with an embodiment of the present invention.

FIG. 11 depicts a cross-sectional view of substrate 30 after fabrication steps to deposit coating 80 in a process to create liquid level sensor 300 in accordance with an embodiment of the present invention. In various embodiments, coating 80 is composed of a dielectric material resistive to etchants for fill 66 removal. For example, coating 80 is a nitride coating deposited by chemical vapor deposition, ALD, PVD, CVD, spin coating, or other suitable deposition process. For example, a nitride material is resistant to etchants such as hydrofluoric acid or a buffered hydrofluoric acid used to remove fill 66 when fill 66 is, for example, $SiO_2$. In one embodiment, a material selection for coating 80 includes a consideration of a material providing a lower friction with liner 54 (and/or substrate 30 in embodiments without liner 54) while still providing a resistance to etching of fill 66 and non-conductivity.

Figure 12:
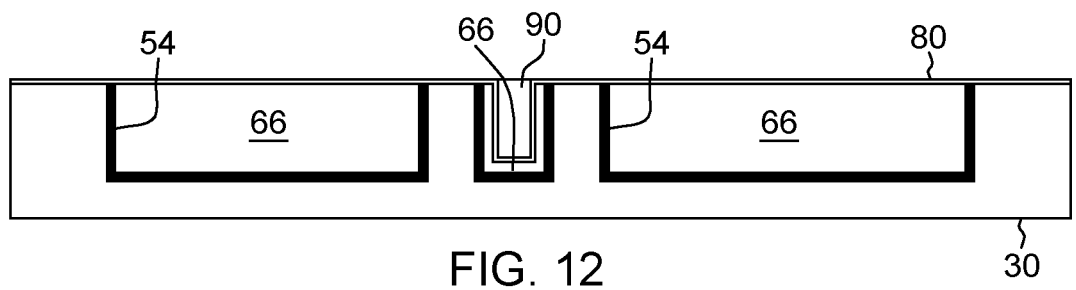
FIG. 12 depicts a cross-sectional view of the substrate after fabrication steps to deposit a float in a process to create a liquid level sensor in accordance with an embodiment of the present invention.

FIG. 12 depicts a cross-sectional view of substrate 30 after fabrication steps to deposit float 90 in a process to create liquid level sensor 300 in accordance with an embodiment of the present invention. As depicted, FIG. 12 includes substrate 30, liner 54, fill 66, release coating 80, and float 90. In various embodiments, float 90 is composed of a low density material buoyant in one or more liquids to be measured for height (e.g., liquid 35 in FIG. 3). For example, a xerogel material with a very low density, capable of floating in various liquids or reagents, can be deposited using semiconductor deposition processes (e.g., CVD, PVD, ALD, etc.) on coating 80 in the region or recessed area where the portion of fill 66 was removed between two raised regions or the two sides of tube 310.

In an embodiment, float 90 is not deposited on coating 80 but is formed in another location (e.g., not on substrate 30) and is placed in the recess created by the removal of fill 66 after the fabrication steps to remove a portion of fill 66 in a central area between the two sides of tube 310. For example, float 90, formed in another location, is composed of a single material, such as a xerogel material, or is composed of a composite material, such as a xerogel material coated and is with a layer of nitride, that is resistant to various etchants used in liquid level sensor 100 fabrication. In another example, float 90 formed from a xerogel material is coated with a low friction material or a chemically inert material, such as a layer of graphene during fabrication before placement. In one embodiment, a precision robotic assembly unit or robotic placement machine or other similar high precision, micro-scale placement device can place float 90, fabricated separately from substrate 30, in the channel or recess created by the removal of fill 66 as discussed with reference to FIG. 10.

Figure 13:
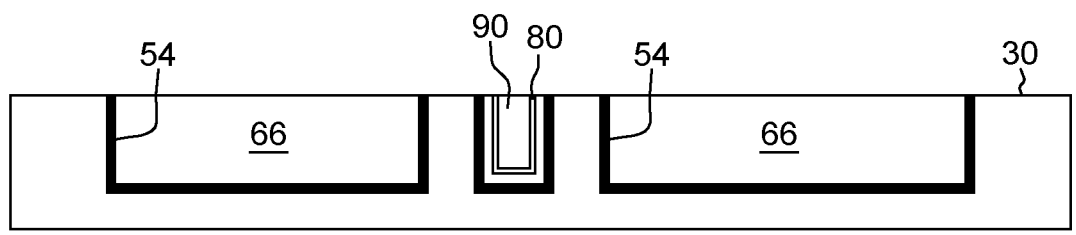
FIG. 13 depicts a cross-sectional view of the substrate after fabrication steps to planarize the substrate after depositing the float in a process to create a liquid level sensor in accordance with an embodiment of the present invention.

FIG. 13 depicts a cross-sectional view of substrate 30 after fabrication steps to planarized substrate 30 after depositing float 90 in a process to create liquid level sensor 300 in accordance with an embodiment of the present invention. As depicted, FIG. 13 includes substrate 30, liner 54, fill 66, float 90, and a portion of coating 80 remaining in the channel between the two sides of tube 310 after planarization. A planarization process such as CMP removes a portion of coating 80 over fill 66 and a portion of coating 80 over substrate 30, a thin, top portion of fill 66, and a thin, top portion of substrate 30 while leaving most of substrate 30, liner 54, a portion of coating 80, float 90, and fill 66 intact.

Figure 14:
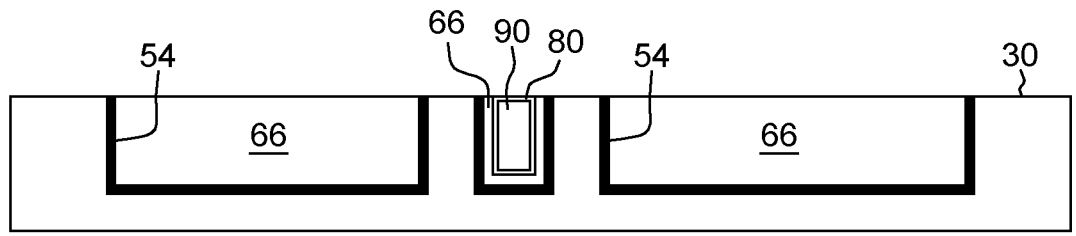
FIG. 14 depicts a cross-sectional view of the substrate after fabrication steps to deposit a liner over the float in a process to create a liquid level sensor in accordance with an embodiment of the present invention.

FIG. 14 depicts a cross-sectional view of substrate 30 after fabrication steps to deposit coating 80 over float 90 in a process to create liquid level sensor 300 in accordance with an embodiment of the present invention. As depicted, FIG. 14 includes substrate 30, liner 54, fill 66, and coating 80 on all sides of float 90. In various embodiments, coating 80 is selectively deposited (e.g., by CVD, ALD, etc.) on a top surface of float 90. As previously discussed with regard to FIGS. 1 and 11, coating 80 protects float 90 from etchants and can provide other desirable attributes (e.g., reduced friction, improve rigidity, etc.).

Figure 15:
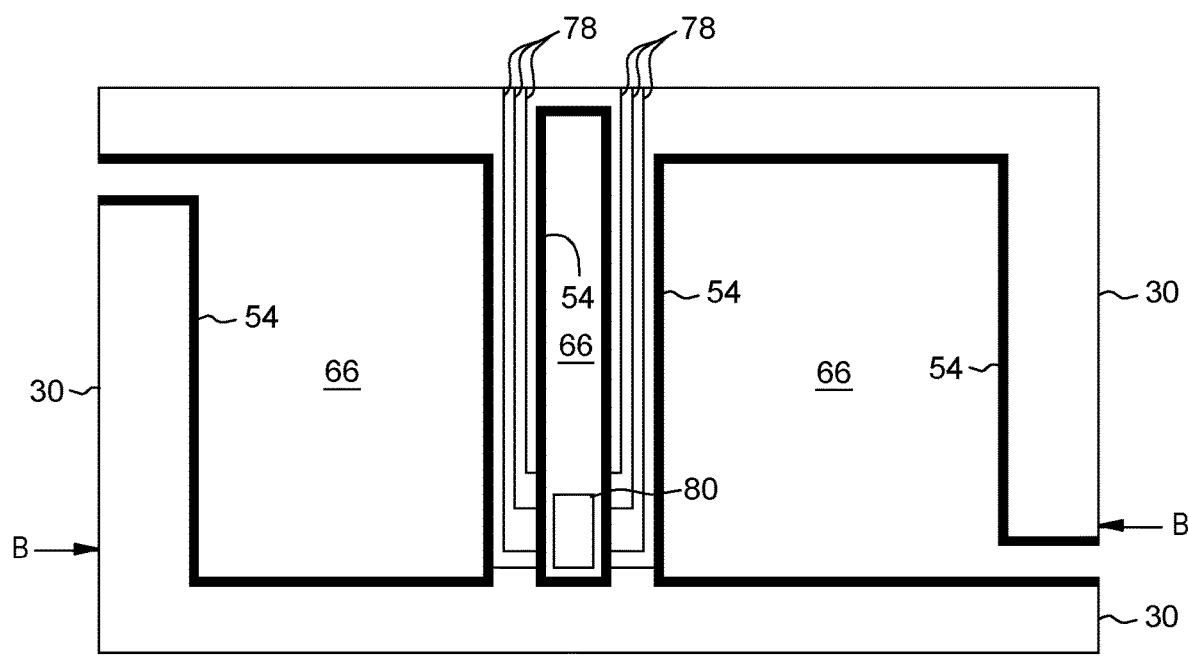
FIG. 15 depicts a top view of the substrate after fabrication steps to deposit a liner over the float in a process to create a liquid level sensor in accordance with an embodiment of the present invention.

FIG. 15 depicts a top view of substrate 30 after fabrication steps to deposit coating 80 over float 90 in a process to create liquid level sensor 300 in accordance with an embodiment of the present invention. As depicted, FIG. 15 includes substrate 30, liner 54, fill 66, circuit lines 78, and coating 80 covering float 90. Coating 80 covering float 90 is surrounded by a thin layer of fill 66 removed in later steps to release float 90 covered by coating 80. The two sides of tube 310 will form facing sides in a rectangular tube (e.g., forming tube 310 in FIG. 3) when the fabrication of liquid level sensor 300 is complete. The termination of circuit lines 78 extending through liner 54 into fill 66 will become electrical contacts (e.g., electrical contacts 12A and 12B in FIG. 3) used to determine a liquid height. Channels or an inlet and an outlet for liquids are depicted in FIG. 15 in the top left corner of substrate 30 and the bottom right corner of substrate 30.

Figure 19:
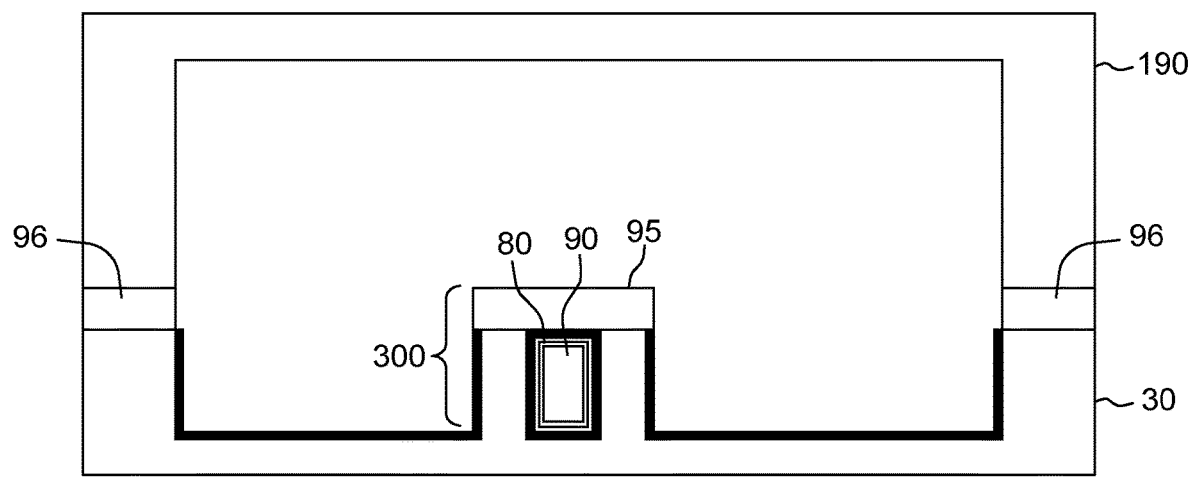
FIG. 19 depicts a cross-sectional view of the substrate after fabrication steps to attach a cap for a reservoir enclosure in a process to create a liquid level sensor in accordance with an embodiment of the present invention.

FIG. 16 depicts a cross-sectional view of substrate 30 after fabrication steps to bond side 95 to two raised walls of substrate 30 in a center area of substrate 30 in a process to create liquid level sensor 300 in accordance with an embodiment of the present invention. As depicted, FIG. 16 includes substrate 30, liner 54, fill 66, coating 80, float 90, side 95, and one or more of shim 96. In various embodiments, side 95 and shim 96 are composed of the same material as substrate 30. For example, side 95 and shim 96 are PMMA, PC, or another handle material for MEMS micro-fluidic devices. In an embodiment, side 95 and shim 96 a semiconductor material or a non-conductive material compatible that is with fill 66 etchants and various liquids to be measured that is capable of bonding to substrate 30 and that is capable of withstanding handling during liquid level sensor 300 fabrication and use. In various embodiments, liner 54 is patterned selectively on side 95 in an area in contact with fill 66 prior to bonding to substrate 30. In various embodiments, one or more of shim 96 are not present. For example, when shim 96 are not present, the length of the sides of a cap attached later in FIG. 19 are longer to create a reservoir. Shim 96, when present, can aide in handling of substrate 30 and can aide in later bonding processes to attach a cap or lid.

FIG. 17 depicts a cross-sectional view of substrate 30 after fabrication steps to remove fill 66 in a process to create liquid level sensor 300 in accordance with an embodiment of the present invention. As depicted, FIG. 17 includes substrate 30, liner 54, coating 80, float 90, and side 95. One or more etching processes are used to remove fill 66 from the large recesses on either side of the two sides of tube 310 and from the area inside the two sides of 310 (e.g., partially enclosing float 90). For example, a wet etch, an RIE etch, or a combination of wet and dry etches can be used to remove fill 66 from the large areas of fill 66 deposited in recessed areas of substrate 30 on either side of side 95. In various embodiments, a wet etch of fill 66 removes the portion of fill 66 partially enclosed under side 95 area (e.g., created by the two sides of tube 310) that includes the thin, layers of fill 66 surrounding coating 80, which cover float 90. In an embodiment, agitation of etchants using a megasonic device (e.g., using acoustic waves) during etching aides in the removal of fill 66 between the two sides of tube 310 and under side 95. For example, a buffered hydrofluoric etchant solution or other similar etchant for removing fill 66 (e.g., an oxide) removes fill 66 under side 95 and the thin layers of fill 66 surrounding coating 80 on float 90. In various embodiments, coating 80 encasing float 90 (e.g., a nitride or other similar material resistant to fill 66 etchants) protects float 90 material from etchants.

Upon completion of fill 66 removal, as depicted in detail A of FIG. 17, float 90 covered by coating 80 is released or free within the four walls created by substrate 30 coated with liner 54 and side 95. In various embodiments, liner 54 coats the interior surfaces of substrate 30 and side 95 (i.e., the side of side 95 adjacent to float 90) to provide hydrophobic properties for self-cleaning of liquid level sensor 300 upon completion. In an embodiment, liner 54 does not coat the interior surfaces of substrate 30 and side 95. In an embodiment, float horizontal dimensions including float 90 and protective coating 80 are 0.3 micrometers to five micrometers less than the horizontal dimensions of the interior of the two sides of tube 310 with liner 54.

Figure 18:
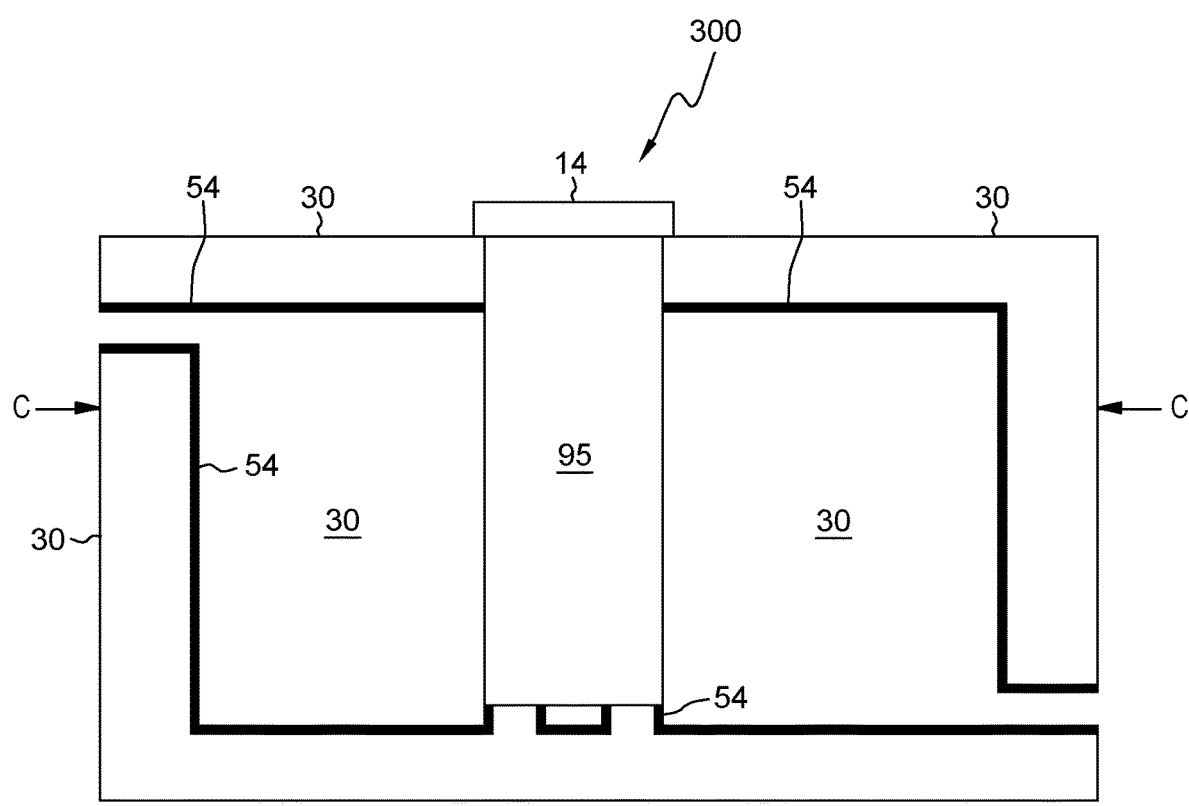
FIG. 18 depicts a top view of the substrate after fabrication steps to remove a fill in a process to create a liquid level sensor in accordance with an embodiment of the present invention.

FIG. 18 depicts a top view of substrate 30 after fabrication steps to remove fill 66 in a process to create liquid level sensor 300 in accordance with an embodiment of the present invention. As depicted in a top down view in FIG. 18, liquid level sensor 300 includes cap 14, side 95, and liner 54 around the two sides of tube 310 extending below side 95. Side 95 creates a top side of the four sides partially enclosing float 90 (not depicted) in liquid level sensor 300. In various embodiments, side 95 extends just above the bottom of substrate 30. For example, side 95 does not extend down to the bottom edge of substrate 30 but leaves a small channel or opening for liquid entry and exit into the bottom of liquid level sensor 300. Holes or openings in the bottom of one or more of the other walls of liquid level sensor 300 can be used to provide liquid exit and entry into liquid level sensor 300. Additionally, the presence of one or more opening or holes in side 95 can improve wet etch of fill 66 (e.g., oxide material) inside tube 310. In an embodiment, side 95 includes one or more small holes or channels (not depicted)

at the top of side 95 allowing airflow into and out of liquid level sensor 300. In various embodiments, holes or openings in side 95 are not required in some designs of liquid level sensor 100, as forces related to air compression when float 90 rises, are negligible compared to the buoyant forces from float 90.

Cap 14 is bonded to a top central surface of substrate 30 corresponding to an area created above the two sides of tube 310. In various embodiments, an electrically conductive adhesive or an electrically conductive wafer bond material bonds cap 14 to substrate 30 and to each of circuit lines 78 (not depicted in FIG. 18). Cap 14 electrically connects to each of circuit lines 78 that terminate in one end at the outer top edge of substrate 30 over the two sides of tube 310. Circuit lines 78 electrically connect to one or more electrical devices (not depicted in FIG. 18), such as a MUX device, logic circuits, and the like, in cap 14 as previously discussed in detail with reference to FIG. 1. In an embodiment, an electrically conductive material or adhesive bonds cap 14 to substrate 30, circuit lines 78, and side 95. In an embodiment, bonding of cap 14 leaves a gap (not depicted) for airflow between the top edge of side 95 and a side edge of cap 14.

FIG. 19 depicts a cross-sectional view of substrate 30 after fabrication steps to attach cover 190 for a reservoir enclosure in a process to create liquid level sensor 300 in accordance with an embodiment of the present invention. As depicted, FIG. 19 includes cover 190, side 95, shim 96, float 90 coated with protective coating 80, and substrate 30. In various embodiments, cover 190 is a component or element with four sides and a top bonded to four top surfaces of shim 96 on substrate 30 to create reservoir 36 in FIG. 3. In an embodiment, shim 96 are not present and the length of the four vertical sides of cover 190 bonding directly to substrate 30 is increased. Cover 190 consist of four sides and a bottom, which upon bonding to four sides of substrate 30 create a reservoir or tank for liquid containment and includes liquid level sensor 300. For example, a reservoir or tank formed after cover 190 is bonded to the four sides of substrate 30 can be used in conjunction with a MEMS pump, where liquid level measurements or liquid height determined by one or more electrical devices in cap 14 (cap 14 depicted in FIG. 18), provides feedback for monitoring MEMS pump performance. In various embodiments, cover 190 is composed of the same material as substrate 30 or composed of another material compatible with one or more liquids to be measured that can be bonded to shim 96 using known adhesives or wafer bonding processes. Cover 190 bonded to substrate 30 by shim 96 provides sufficient structural strength for the reservoir (i.e., reservoir 36 in FIG. 3) for the end-use application. Similarly, as known to one skilled in the art, a shape and size of cover 190 and substrate 30 forming the reservoir depend on an application requirements and are not limited to the sizes or shapes included in the embodiments and examples discussed.

Figure 20:
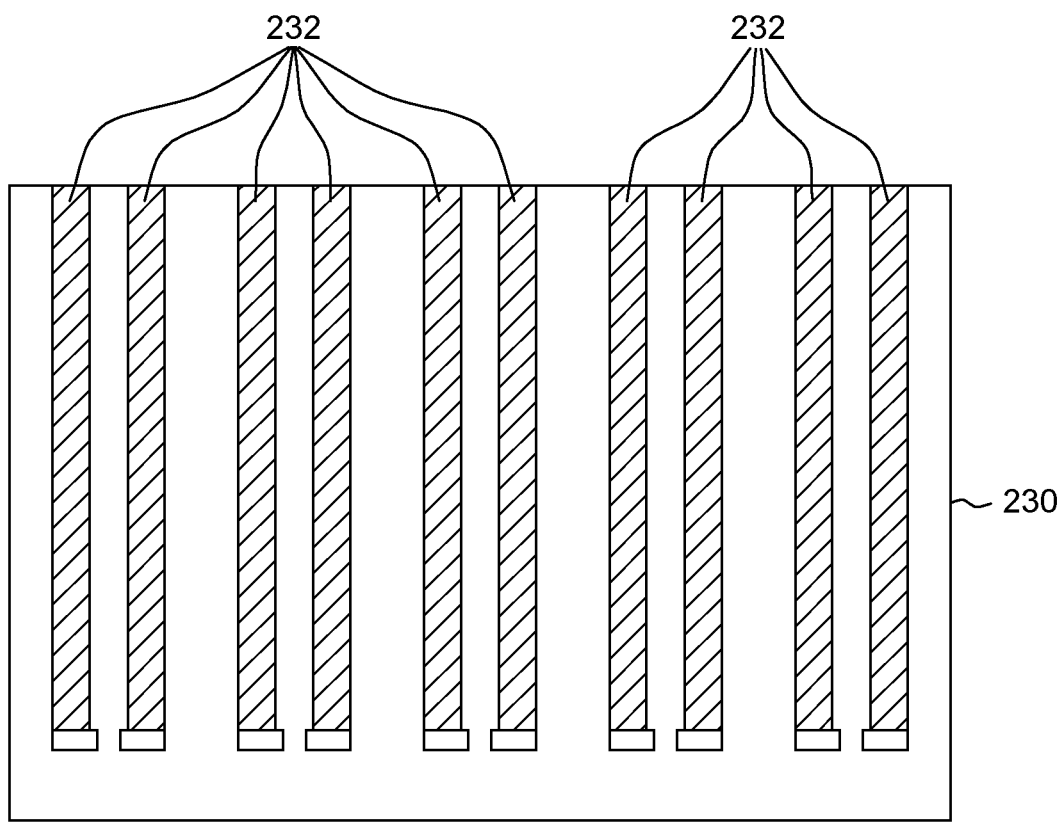
FIG. 20 depicts a top down view of a substrate after fabrication steps to deposit and pattern resist on the substrate in a process to create a plurality of liquid level sensors in accordance with an embodiment of the present invention.

FIG. 20 depicts a top down view of substrate 30 after fabrication steps to deposit and pattern resist on substrate 30 in a process to create a plurality of liquid level sensors 100 on substrate 30 in accordance with an embodiment of the present invention. As depicted, FIG. 20 includes substrate 30 and resist 32. The resist 32 pattern in substrate 30 can be used to create five liquid level sensors 100 upon completion of the processes discussed in detail with reference to FIGS. 4-18. After completion of the processes discussed in detail with reference to FIGS. 4-18, an etch of substrate 30 around each of the five liquid level sensors 100 (e.g., outlined by resist 32 in FIG. 20) releases the five liquid level sensors 100 for use in an application such as a micro-liquid dispense.

Figure 21A:
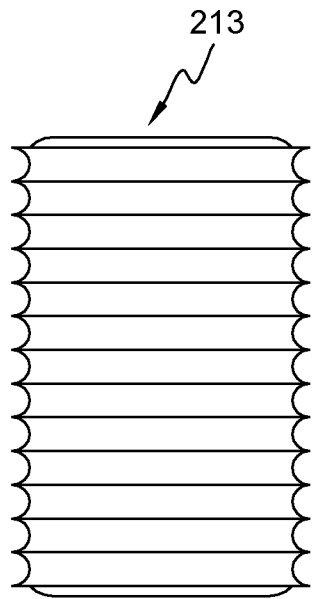
FIGS. 21A, 21B, and 21C depict a design of a float in accordance with an embodiment of the present invention.
Figure 21B:
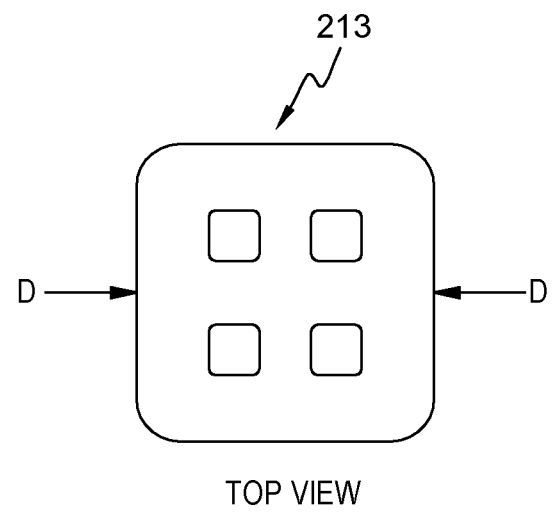
Figure 21C:
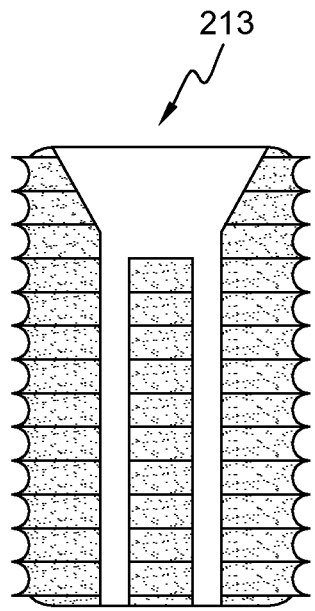

FIGS. 21A, 21B, and 21C depict a design of float 213 in accordance with an embodiment of the present invention. As depicted, FIG. 21A includes a side view 21A of float 213, FIG. 21B depicts a top view 21B of float 213, and FIG. 21C depicts a cross-section 21C of float 213. In various embodiment, a scalloping of the vertical sides of float 213 reduces the contact area of float 213 with the interior walls of a tube in a liquid level sensor. For example, scalloping of the vertical walls of float 213, as depicted in side view 21A and cross-section 21C, reduces the contact area of float 213 with an interior wall of a liquid level sensor, such as liquid level sensor 100 in FIG. 1. A reduced contact area between float 213 and the interior walls of liquid level sensor reduces friction between float 213 and the interior walls of the liquid level sensor. Additionally, scalloping the vertical walls of float 213 may aide in self-cleaning of the liquid level sensor due to multiple projections on float 213 created by the scalloped edges of float 213. The scalloping aiding in self-cleaning may allow a reduction in the tolerances between float 213 and the interior walls of a liquid level sensor. In various embodiments, tolerances between float 213 and the interior walls of the liquid level sensor can be optimized based on the level scalloping of the edges of float 213, such as how many scallops or how deep of a scallop. Float 213 may be fabricated by micro-machining, nano-impression processes, or semiconductor manufacturing processes (e.g., RIE or wet etch) and coated with a protective coating, such as a nitride material.

As depicted in side view 21B and cross-section 21C, float 213 includes holes formed vertically through float 213 and a recess in a top surface of float 213. In one embodiment, float 213 includes recesses formed in both a top and a bottom surface of float 213. Holes in float 213 and recesses in float 213 can be formed with the processes discussed above with respect to scallops formed in float 213. The presence of holes or recesses in float 213 reduces pressure differentiation above float 213. Additionally, as depicted in float 213, the corners of float 213 are rounded to minimize binding of float 213 with the interior walls of the liquid level sensor as float 213 and improve float 213 movement as float 213 moves up and in the liquid level sensor. Similarly, as depicted in side view 21A and 21B the top and bottom edges of float 213 in contact with the interior walls of the liquid level sensor are slightly rounded to improve movement of float 213 in the liquid level sensor.

Float 213 may be used in any one of the liquid level sensor embodiments discussed in the present invention (i.e., in liquid level sensor 100, liquid level sensor 200, or liquid level sensor 300). Additionally, one or more of the design features discussed with reference to float 213 (e.g., scalloped edges, holes, recesses, rounded corners, etc.) can be incorporated in any float used in a liquid level sensor (e.g., in float 13 depicted in FIG. 1).

What is claimed is:
1. A self-cleaning sensor to determine a level of a liquid, comprising:
    a tube with an interior coating, wherein the tube includes
        a plurality of horizontally aligned, electrically isolated, electrical contacts, wherein each electrical contact of the plurality of electrical contacts each terminate in an outer surface of an interior wall of the tube and are electrically connected to one or more electrical devices in a cap residing on the tube; and
    a float, wherein the float is composed of a low density, low dielectric constant material buoyant in one or more liquids to be measured, wherein each horizontal dimension of the float corresponds to each horizontal dimension of the tube.

2. The sensor of claim 1, wherein the interior coating of the tube is a hydrophobic coating.

3. The sensor of claim 1, wherein a self-cleaning of the tube in the sensor is based, at least in part, on a motion of the float in the tube as the one or more liquids exit the sensor.

4. The sensor of claim 1, wherein the self-cleaning of the tube in the sensor is based, at least in part, on using a hydrophobic material for the interior coating of the tube.

5. The sensor of claim 1, wherein the interior coating of the tube is composed of a polydimethylsiloxane material.

6. The sensor of claim 1, wherein the tube is composed of one of a poly methyl methacrylate material or a polycarbonate material.

7. The sensor of claim 1, wherein the float is comprised of a xerogel material.

8. The sensor of claim 1, wherein a protective layer of a dielectric material covers the float.

9. The sensor of claim 1, wherein a layer of nitride covers the float.

10. The sensor of claim 1, wherein one or more sides of the float are scalloped for reduced friction with at least one interior wall of the tube in the sensor.

11. The sensor of claim 1, wherein the float includes one or more holes extending vertically through the float.

12. The sensor of claim 1, wherein the sensor dispenses a precise volume of the one or more liquids.

13. The sensor of claim 1, wherein the sensor is embedded in a wall of a reservoir.

14. The sensor of claim 1, wherein the sensor is located in a reservoir and supported by one or more struts.

15. The sensor of claim 1, wherein the one or more horizontal dimensions of the float are 0.3 micrometers to 5 micrometers less than the one or more horizontal dimensions of the interior of the tube.

16. A method of fabricating a self-cleaning sensor for determining a level of a liquid, the method comprising:
    patterning a resist on a substrate;
    partially removing a plurality of portions of a substrate from a plurality of exposed regions of the substrate creating a plurality of raised portions of the substrate around each of an outer edge of the substrate and two raised parallel portions of the substrate extending from a first raised portion of one of the outer edges of the substrate to a second raised portion of an opposite outer edge of the substrate;
    depositing a layer of hydroscopic material over the substrate;
    depositing a trench material in the plurality of portions of the substrate partially removed;
    forming a plurality of circuit lines on a top surface of the of the substrate on the two raised parallel portions of the substrate extending from the first raised portion of one of the outer edges of the substrate to the second raised portion of an opposite outer edge of the substrate, wherein the plurality of circuit lines each extend through the layer of the hydroscopic material to terminate in a first end on one of two facing interior edges of the two raised parallel portions of the substrate forming horizontally aligned pairs of circuit line terminations and each of the plurality of circuit lines terminate in a second end in a top edge of the substrate directly above the two raised parallel portions of the substrate;
    removing a top surface of each of the plurality of raised portions of the substrate, the layer of the hydroscopic material on each of the plurality of raised portions of the substrate, and a top portion of the trench material;
    partially removing a portion of the trench material from between the two raised parallel portions of the substrate extending from the first raised portion of one of the outer edges of the substrate to the second raised portion of an opposite outer edge of the substrate, wherein a thin layer of the trench material remains on a bottom surface of the substrate between the two raised parallel portions of the substrate and on each of a vertical surface of facing interior walls of the two raised parallel portions of the substrate;
    placing a float in a recessed area created from the portion of the trench material removed from between the two raised parallel portions of the substrate;
    bonding a rectangular component composed of a material used in the substrate to each top surfaces of the two raised parallel portions of the substrate extending from the first raised portion of one of the outer edges of the substrate to the second raised portion of an opposite outer edge of the substrate and to a top surface of two of the raised portions of the substrate along each of an outer edge of the substrate, wherein a plurality of dimensions of the rectangular component correspond with a plurality of outer dimensions of two raised parallel portions of the substrate;
    bonding a cap to a top surface of the substrate and each of the plurality of circuit lines that terminate in the second end in the top edge of the substrate; and
    bonding a component with four sides and a bottom to the outer edges of the substrate to form a reservoir.

17. The method of claim 16, wherein placing the float in the recessed area created by partially removing the portion of the trench material from between the two raised parallel portions of the substrate further comprises:
    placing the float in the recessed area created by partially removing the portion of the trench material from between the two raised parallel portions of the substrate using a robotic placement machine.

18. The method of claim 16, wherein the float is etched to form scalloped edges on one or more edges of the float associated with the two raised parallel portions of the substrate extending from the first raised portion of one of the outer edges of the substrate to the second raised portion of an opposite outer edge of the substrate.

19. The method of claim 16, wherein placing the float in the recessed area created by partially removing the portion of the trench material from between the two raised parallel portions of the substrate further comprises:
    depositing a layer of a material resistant to trench material etchants over exposed surfaces of the substrate, the layer of the hydrophobic material, and the trench material;
    planarizing a top surface of the substrate, the layer of hydrophobic material, a top surface of the trench material, and the layer of material resistant to trench material etchants, wherein the layer of the material resistant to trench material etchants remains in recessed area created by partially removing the portion of the trench material from between the two raised parallel portions of the substrate;
    selectively depositing a low density, dielectric material in a recessed area created from the portion of the trench material removed from between the two raised parallel portions of the substrate; and selectively depositing a layer of the material resistant to trench material etchants over the low density, low dielectric material.

20. A method of determining a level of a liquid by a sensor, the method comprising:

receiving, by one or more electrical devices in a cap of a sensor, an electrical output from one or more pairs of horizontally aligned electrical contacts extending through an interior wall of opposing sides of a micro-scale tube in the sensor with a hydrophobic material coating an interior of the micro-scale tube when the one or more pairs of horizontally aligned electrical contacts extending through the interior wall of the tube are electrically connected by a liquid; and determining, by the one or more electrical devices in the cap of the sensor, a level of the liquid in the micro-scale tube of the sensor based, at least in part, on the electrical output received from the one or more pairs of horizontally aligned electrical contacts extending through the interior wall of the micro-scale tube that are electrically connected by the liquid.

* * * * *